(12) United States Patent
Dang et al.

(10) Patent No.: US 12,374,394 B2
(45) Date of Patent: Jul. 29, 2025

(54) DEGRADATION-AWARE TRAINING SCHEME FOR RELIABLE MEMRISTOR DEEP LEARNING ACCELERATOR DESIGN

(71) Applicants: The Regents of the University of California, Oakland, CA (US); Texas A&M University, College Station, TX (US)

(72) Inventors: Dharanidhar Dang, San Diego, CA (US); Debashis Sahoo, San Diego, CA (US); Bill Lin, Encinitas, CA (US); Rabi Mahapatra, College Station, TX (US); Aurosmita Khansama, College Station, TX (US); Sudharsan Govardan, College Station, TX (US)

(73) Assignee: The Regents of the University of California, Oakland, CA (US)

( * ) Notice: Subject to any disclaimer, the term of this patent is extended or adjusted under 35 U.S.C. 154(b) by 130 days.

(21) Appl. No.: 18/173,242

(22) Filed: Feb. 23, 2023

(65) Prior Publication Data
US 2023/0267997 A1    Aug. 24, 2023

Related U.S. Application Data

(60) Provisional application No. 63/313,253, filed on Feb. 23, 2022.

(51) Int. Cl.
  *G11C 11/00*   (2006.01)
  *G06N 3/08*    (2023.01)
  (Continued)

(52) U.S. Cl.
  CPC .......... *G11C 13/0035* (2013.01); *G06N 3/08* (2013.01); *G11C 11/54* (2013.01); *G11C 13/0069* (2013.01)

(58) Field of Classification Search
  CPC . G11C 13/0035; G11C 11/54; G11C 13/0069; G06N 3/08; G06N 3/09; G06N 3/065; G06N 3/084
  (Continued)

(56) References Cited

U.S. PATENT DOCUMENTS 7,872,929 B2 * 1/2011 Dell .................. H01L 25/18
                                                        365/201
10,672,464 B2 * 6/2020 Jeng ................ G11C 13/0028

OTHER PUBLICATIONS

Cai, F., et al., "A Fully Integrated Reprogrammable Memristor—CMOS System for Efficient Multiply-Accumulate Operations." Nature Electronics, 2(7), pp. 290-299, 2019.
(Continued)

*Primary Examiner* — Tha-O H Bui
(74) *Attorney, Agent, or Firm* — FisherBroyles LLP; Pedro F. Suarez

(57) ABSTRACT

A method, a system, and computer program product for degradation-aware training of neural networks are provided. A degradation of degraded memory cells of a memory array is detected, during a training of a neural network. A first set of writing parameter values to be applied to the one or more degraded memory cells and a second set of writing parameter values to be applied to the undegraded memory cells is determined using a model of the memory array tuned to account for the degradation of one or more memory cells. A writing operation is executed, by applying the first set of writing parameter values to the one or more degraded memory cells to compensate for the degradation of the one or more degraded memory cells and by applying the second set of writing parameter values to the undegraded memory cell.

20 Claims, 13 Drawing Sheets

(51) Int. Cl.
*G11C 11/54* (2006.01)
*G11C 13/00* (2006.01)

(58) Field of Classification Search
USPC .......................................................... 365/148
See application file for complete search history.

(56) References Cited

OTHER PUBLICATIONS

Cai, Y., et al., "Long Live Time: Improving Lifetime For Training-In-Memory Engines By Structured Gradient Sparsification." In Proceedings of the 55th Annual Design Automation Conference (pp. 1-6), Jun. 2018.

Chen, B., et al., "Physical Mechanisms of Endurance Degradation in TMO-RRAM." In 2011 International Electron Devices Meeting (pp. 12.3.1-4), Dec. 2011.

Dang, D., et al., "BPhoton-CNN: An Ultrafast Photonic Backpropagation Accelerator or Deep Learning." ACM/SIGDA Great Lake Symposium in VLSI (GLSVLSI) 2020.

Hu, M., et al., "Dot-Product Engine for Neuromorphic Computing: Programming 1T1M Crossbar to Accelerate Matrix-Vector Multiplication." IEEE/ACM Design Automation Conference (DAC), 2016.

Kingma, D. P. et al., "Adam: A method for stochastic optimization." arXiv preprint arXiv:1412.6980, 2014.

Krestinskaya, O., et al., "Binary Weighted Memristive Analog Deep Neural Network for Near-Sensor Edge Processing." In 2018 IEEE 18th International Conference on Nanotechnology (IEEE-NANO) (pp. 1-5), Jul. 2018.

Lammie, C., et al., MemTorch: An Open-Source Simulation Framework for Memristive Deep Learning Systems. arXiv preprint arXiv:2004.10971, 2020.

Lecun, Y. et al., "MNIST handwritten digit database." *AT&T Labs* [Online]. Available: http://yann.lecun.com/exdb/mnist, 2, 2010.

Nichols, B.M., et al., "Advances in 2D Materials for Electronic Devices." In Semiconductors and Semimetals (vol. 95, pp. 221-277). 2016. Elsevier.

Paszke A., et al., "PyTorch: An Imperative Style, High-Performance Deep Learning Library." In: Advances in Neural Information Processing Systems 32 [Internet]. Curran Associates, Inc.; 12 pages, 2019.

Shafiee, A., et al., "ISAAC: A Convolutional Neural Network Accelerator with In-Situ Analog Arithmetic in Crossbars." IEEE/ACM International Symposium on Computer Architecture (ISCA), 2016.

Song, L. et al., "PipeLayer: A Pipelined ReRAM-Based Accelerator for Deep Learning," IEEE International Symposium on High Performance Computer Architecture (HPCA), Feb. 2017.

Uddin, M., et al., "Techniques for Improved Reliability In Memristive Crossbar PUF Circuits." In 2016 IEEE Computer Society Annual Symposium on VLSI (ISVLSI) (pp. 212-217), Jul. 2016.

Woo, J., et al., Improved Synaptic Behavior under Identical Pulses Using AlO x/HfO 2 Bilayer RRAM Array for Neuromorphic Systems. IEEE Electron Device Letters, 37(8), pp. 994-997, 2016.

Xia, L., et al., "Stuck-at Fault Tolerance in RRAM Computing Systems." IEEE Journal on Emerging and Selected Topics in Circuits and Systems, 8(1), pp. 102-115, 2017.

Zhang, S., et al., "Aging-Aware Lifetime Enhancement for Memristor-Based Neuromorphic Computing." In 2019 Design, Automation & Test in Europe Conference & Exhibition (pp. 1730-1735), Mar. 2019.

* cited by examiner

MEMRISTOR CROSSBAR AGING %

DEGRADATION-AWARE TRAINING SCHEME FOR RELIABLE MEMRISTOR DEEP LEARNING ACCELERATOR DESIGN

CROSS-REFERENCE TO RELATED APPLICATIONS

The present application claims priority to U.S. Provisional Patent Appl. No. 63/313,253 to Dang et al., filed Feb. 23, 2022, and entitled "Degradation-aware Training Scheme for Reliable Memristor Deep Learning Accelerator Design," and incorporates its disclosure herein by reference in its entirety.

TECHNICAL FIELD

This disclosure relates generally to data processing and, in particular, to degradation-aware training of neural networks, where the training of neural networks can occur on hardware platforms.

BACKGROUND

Deep learning has garnered special attention worldwide because of its ability to learn with high accuracy. With the rise in deep learning model size, they become highly energy, latency, and memory-intensive. Therefore, energy efficiency (in GFlops/Watt) has become a critical factor while comparing performances of today's deep learning accelerators. A major reason why traditional CPU/GPU are not able to offer this energy efficiency demand is due to their processor-memory speed gap.

SUMMARY

Methods, systems, and articles of manufacture, including computer program products, are provided for degradation-aware training of neural networks. In one aspect, a computer-implemented method includes: detecting, during a training of a neural network, a degradation of one or more degraded memory cells of a memory array including a plurality of memory cells, at least a portion of the plurality of memory cells including an undegraded memory cell; determining, using a model of the memory array tuned to account for the degradation of one or more memory cells, a first set of writing parameter values to be applied to the one or more degraded memory cells and a second set of writing parameter values to be applied to the undegraded memory cells; and executing a writing operation, by applying the first set of writing parameter values to the one or more degraded memory cells to compensate for the degradation of the one or more degraded memory cells and by applying the second set of writing parameter values to the undegraded memory cell.

In some variations, one or more features disclosed herein including the following features can optionally be included in any feasible combination. In some implementations, the plurality of memory cells include resistive memory cells. In some implementations, detecting the degradation of one or more degraded memory cells includes: determining, using a degradation model, storing conductance values that are different from written conductance values. In some implementations, the degradation model processes the plurality of memory cells using as input a value of maximum resistance and the written conductance values to generate a matrix of the storing conductance values. In some implementations, detecting the degradation of one or more degraded memory cells includes: scanning, using a current meter, a conductance value of each memory cell of the plurality of memory cells; and determining a conductance change by comparing the conductance value of each memory cell to a previous conductance value stored by a buffer. In some implementations, the first set of writing parameter values and the second set of writing parameter values comprise a current, a voltage, a signal frequency or a pulse width. In some implementations, executing the writing operation, by applying the first set of writing parameter values to the one or more degraded memory cells to compensate for the degradation of the one or more degraded memory cells comprises reducing memory updates comprising a value of a writing amount, or a magnitude of change, or a frequency of change to the one or more degraded memory cells. In some implementations, the memory updates correspond to parameter updates during a training scheme for neural networks.

In another aspect, a non-transitory computer-readable storage medium includes programming code, which when executed by at least one data processor, causes operations including: detecting, during a training of a neural network, a degradation of one or more degraded memory cells of a memory array including a plurality of memory cells, at least a portion of the plurality of memory cells including an undegraded memory cell; determining, using a model of the memory array tuned to account for the degradation of one or more memory cells, a first set of writing parameter values to be applied to the one or more degraded memory cells and a second set of writing parameter values to be applied to the undegraded memory cells; and executing a writing operation, by applying the first set of writing parameter values to the one or more degraded memory cells to compensate for the degradation of the one or more degraded memory cells and by applying the second set of writing parameter values to the undegraded memory cell.

In some variations, one or more features disclosed herein including the following features can optionally be included in any feasible combination. In some implementations, the plurality of memory cells include resistive memory cells. In some implementations, detecting the degradation of one or more degraded memory cells includes: determining, using a degradation model, storing conductance values that are different from written conductance values. In some implementations, the degradation model processes the plurality of memory cells using as input a value of maximum resistance and the written conductance values to generate a matrix of the storing conductance values. In some implementations, detecting the degradation of one or more degraded memory cells includes: scanning, using a current meter, a conductance value of each memory cell of the plurality of memory cells; and determining a conductance change by comparing the conductance value of each memory cell to a previous conductance value stored by a buffer. In some implementations, the first set of writing parameter values and the second set of writing parameter values comprise a current, a voltage, a signal frequency or a pulse width. In some implementations, executing the writing operation, by applying the first set of writing parameter values to the one or more degraded memory cells to compensate for the degradation of the one or more degraded memory cells comprises reducing memory updates comprising a value of a writing amount, or a magnitude of change, or a frequency of change to the one or more degraded memory cells. In some implementations, the memory updates correspond to parameter updates during a training scheme for neural networks.

In another aspect, a system includes: at least one data processor; and at least one memory storing instructions, which when executed by the at least one data processor, cause operations including: detecting, during a training of a neural network, a degradation of one or more degraded memory cells of a memory array including a plurality of memory cells, at least a portion of the plurality of memory cells including an undegraded memory cell; determining, using a model of the memory array tuned to account for the degradation of one or more memory cells, a first set of writing parameter values to be applied to the one or more degraded memory cells and a second set of writing parameter values to be applied to the undegraded memory cells; and executing a writing operation, by applying the first set of writing parameter values to the one or more degraded memory cells to compensate for the degradation of the one or more degraded memory cells and by applying the second set of writing parameter values to the undegraded memory cell.

In some variations, one or more features disclosed herein including the following features can optionally be included in any feasible combination. In some implementations, the plurality of memory cells include resistive memory cells. In some implementations, detecting the degradation of one or more degraded memory cells includes: determining, using a degradation model, storing conductance values that are different from written conductance values. In some implementations, the degradation model processes the plurality of memory cells using as input a value of maximum resistance and the written conductance values to generate a matrix of the storing conductance values. In some implementations, detecting the degradation of one or more degraded memory cells includes: scanning, using a current meter, a conductance value of each memory cell of the plurality of memory cells; and determining a conductance change by comparing the conductance value of each memory cell to a previous conductance value stored by a buffer. In some implementations, the first set of writing parameter values and the second set of writing parameter values comprise a current, a voltage, a signal frequency or a pulse width. In some implementations, executing the writing operation, by applying the first set of writing parameter values to the one or more degraded memory cells to compensate for the degradation of the one or more degraded memory cells comprises reducing memory updates comprising a value of a writing amount, or a magnitude of change, or a frequency of change to the one or more degraded memory cells. In some implementations, the memory updates correspond to parameter updates during a training scheme for neural networks.

Implementations of the current subject matter can include, but are not limited to, methods consistent with the descriptions provided herein as well as articles that comprise a tangibly embodied machine-readable medium operable to cause one or more machines (e.g., computers, etc.) to result in operations implementing one or more of the described features. Similarly, computer systems are also described that can include one or more processors and one or more memories coupled to the one or more processors. A memory, which can include a non-transitory computer-readable or machine-readable storage medium, can include, encode, store, or the like one or more programs that cause one or more processors to perform one or more of the operations described herein. Computer implemented methods consistent with one or more implementations of the current subject matter can be implemented by one or more data processors residing in a single computing system or multiple computing systems. Such multiple computing systems can be connected and can exchange data and/or commands or other instructions or the like via one or more connections, including, for example, to a connection over a network (e.g. the Internet, a wireless wide area network, a local area network, a wide area network, a wired network, or the like), via a direct connection between one or more of the multiple computing systems, etc.

The details of one or more variations of the subject matter described herein are set forth in the accompanying drawings and the description below. Other features and advantages of the subject matter described herein can be apparent from the description and drawings, and from the claims. While certain features of the currently disclosed subject matter are described for illustrative purposes in relation to customization of database tables, it should be readily understood that such features are not intended to be limiting. The claims that follow this disclosure are intended to define the scope of the protected subject matter.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations. In the drawings.

Figure 1A:
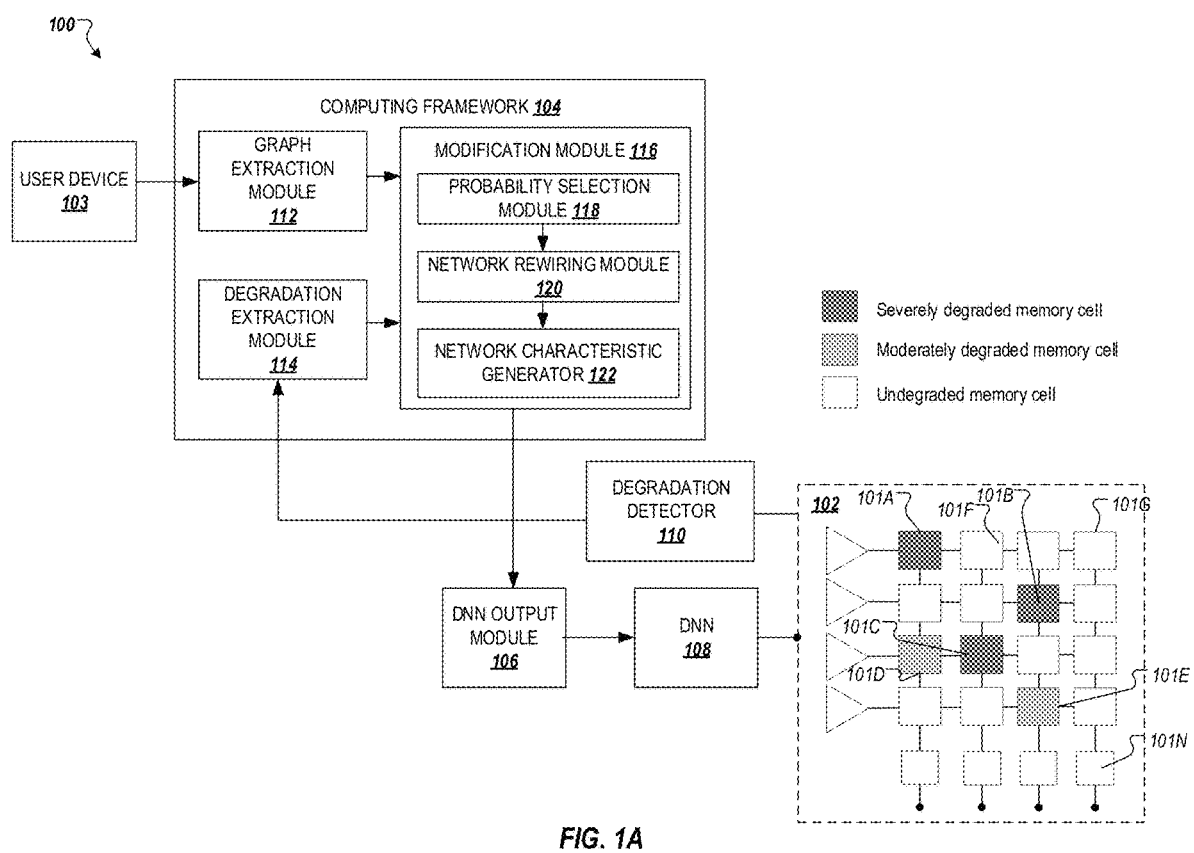
FIGS. 1A and 1B depict diagrams illustrating degradation in an example of a memristor crossbar, in accordance with some example implementations.

When practical, like labels are used to refer to same or similar items in the drawings.

DETAILED DESCRIPTION

Implementations of the present disclosure are generally directed to training of neural networks. More particularly, implementations of the present disclosure are directed to degradation-aware training of neural networks, where the training of neural networks can occur on hardware platforms. Deep learning algorithms can provide classification and/or prediction accuracy at the cost of energy and memory-intensive computing. Resistive memory cells (or memristor) based accelerators are a potential solution owing to their less power consumption, fast switching, and in-memory capability. Memristor-type devices (resistive random access memory, phase change memory, conductive bridge memory, etc.) include non-volatile devices, with conductance states that can be adjusted by applying an electrical impulse. A memristor crossbar (including an array of resistive memory cells) or ReRAM can work at a low power, having an in-memory compute capability, and non-volatile characteristics, providing a potential solution to the energy efficiency demand for deep learning architectures. In some implementations, a memristor-based deep learning accelerator called dot-product engine can be 100 times faster than GPU enabling a design of memristor-based deep learning accelerators. The frequent change in conductance values of memory cells (representing the weight values of neural networks) during deep learning training (or, weight-update) can result in deterioration (aging), which can impact the reliability of a memristor crossbar array.

Degradation due to degradation (aging), voltage/current non-linearity, heating, manufacturing, and device variability are some of the major factors affecting the reliability of memristors. Degradation due to degradation (aging) in memristors occurs due to continuous switching of the conductance value including repetitive writing of new conductance values. The ability of a memristor crossbar to hold the desired conductance value decreases with degradation (aging), affecting the performance of crossbar. The implementations described herein incorporate the degradation (aging) effect to adjust the current values of degraded memory cells and maintain the DNN accuracy.

The implementations described herein provide a degradation (aging)-aware training scheme in conjunction with a CAD approach to enable highly reliable and energy efficient deep learning acceleration in memristor arrays (crossbars). The degradation-aware training scheme (called skewed weight training) includes a (mathematical) model that is configured to emulate degradation (e.g., degradation (aging) related, defect related, and/or heating related degradation) of memory cells of a memristor crossbars. The degradation model is integrated with a computer aided design (CAD) tool to devise a degradation-aware training scheme for highly reliable and energy-efficient memristor crossbar-based deep learning system design. The described model can be integrated in any memory array model (memristor CAD tool) to investigate its performance accurately. The degradation-aware training scheme can incorporate a degradation level of each memory cells to adjust the conductance matrix and current values dynamically thereby maintaining accuracy and energy efficiency. A technical advantage of the degradation-aware training scheme includes a substantial (approximately 25%) increase in the lifetime of a memory array (memristor crossbar) with skewed weight training without affecting the performance of the neural network. The aged skewed weight trained memristor deep neural network shows an increase by approximately 25% improvement in accuracy compared to the aged unskewed memristor deep neural network.

Figure 1B:
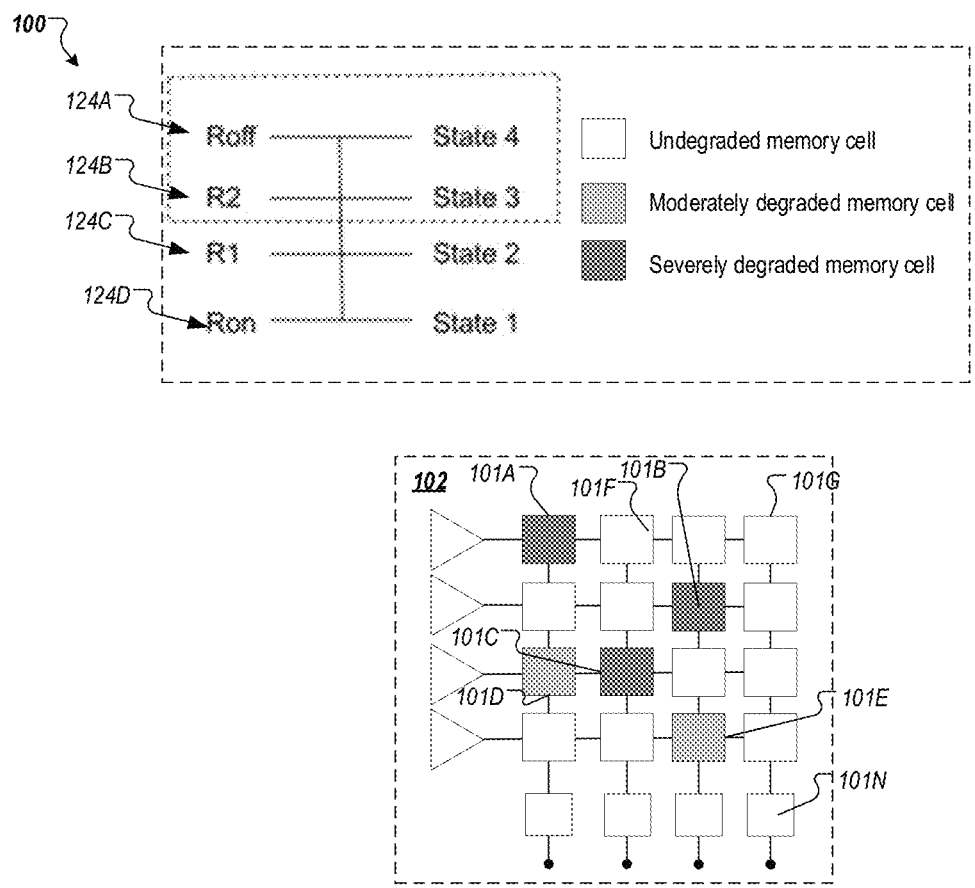

FIGS. 1A and 1B illustrate examples of memory arrays affected by degradation. FIG. 1A depicts a diagram illustrating an example of a system 100 for memristor degradation-adjusted training of neural network. The example system 100 can include a memory array 102, a user device 103, a computing framework 104, a neural network (DNN) output module 106, a DNN 108, and a degradation detector 110.

The memory array 102 can include an array of (resistive) memory cells 101A-101N forming a memristor crossbar or a ReRAM. The memory array 102 can include any type of memristor-type devices (resistive random access memory, phase change memory, conductive bridge memory, etc.) that include non-volatile devices, with conductance states that can be adjusted by applying an electrical impulse. The memory array 102 can work at a low power, having an in-memory compute capability, and nonvolatile characteristics, providing a potential solution to the energy efficiency demand for deep learning architectures. The frequent change in conductance values of memory cells 101A-101N (representing the weight values of the DNN 108) during deep learning training (or, weight-update) can result in deterioration (aging), which can impact the reliability of a memristor array 102. An initial training of the memory array 102 can be based on a DNN description provided by the user device 103, which can be adjusted based on a feedback received from the degradation detector 110.

The user device 103 can interact with the computing framework 104 to configure and initiate DNN applications that include training of a DNN 108. The user device 103 can include a user interface that can enable an entry of a user input including a DNN description. For example, the description of the neural network can be provided to the user device 103 via one or more user interfaces, application programming interfaces, and/or any other means. The user device 103 can include at least one of the following: computer processors, computing networks, software applications, servers, user interfaces, databases, storage locations, memory locations, and/or any combination of hardware and/or software components. The user device 103 can transmit the DNN description to the computing framework 104. The user device 103 can be and/or include any type of processor and memory based device, such as, for example, cellular phones, smart phones, tablet computers, laptop computers, desktop computers, workstations, personal digital assistants (PDA), network appliances, cameras, enhanced general packet radio service (EGPRS) mobile phones, media players, navigation devices, email devices, game consoles, or an appropriate combination of any two or more of these devices or other data processing devices. The user device 103 can include any combination of fixed and variable computing components. Even though, not illustrated, in some implementations, multiple user devices 103 including different computing system configurations, such as different operating systems, different processing capabilities, different hardware components, and/or other differences can concurrently generate the DNN description (by providing different DNN characteristics).

The computing framework 104 that can include hardware, software, and/or any combination thereof, including, but not limited to one or more processors and/or one or more memory components. The framework 104 can be configured to receive as input data a description of the DNN 108 from the user device 103 and degradation data from the degradation detector 110. The computing framework 104 can process the input data to output a new neural network topology adjusted to compensate for the detected degradation of the memory array 102 connected to the DNN 108. The computing framework 104 can include a graph extraction module 112, a degradation extraction module 114, and a modification module 116 that includes a probability selection module 118, a network rewiring module 120, and a network characteristic generator 122. The framework 104 can be configured to include a graph extraction computing component or module 106 to receive the description of the resistive DNN received from the user device 103. The graph extraction module 112 can be configured to process the description of the neural network (e.g., one or more data files and/or collection of data files, etc.). The graph extraction module 112 can generate an undirected graph based on the processed description. The graph can include one or more nodes that can be connected via one or more edges. The edges can represent inter-layer connections in the baseline neural network.

The graph extraction module 112 can be configured to provide the generated graph to the automated architecture modification module 116. The modification module 116 can include a probability selection module 118, a network rewiring module 120, and a new network characteristic generator module 122. The probability selection module 118 can be configured to select a probability p in the interval [0, 1] and using that probability, the network rewiring module 120 can "rewire" the generated graph (e.g., create new connections, remove prior connections, etc. between nodes in the generated graph). The module 116 can determine the conductance values to be stored by the memory array 102 to compensate for the detected degradation.

In some implementations, the input to the computing framework 104 can be a high-level description of the user's desired neural network architecture, which can be also referred to as a baseline model, received from the graph extraction module 112, and a degradation mapping, received from the degradation extraction module 114. The computing framework 104 can convert the network architecture to an undirected graph, where the vertices of the graph can represent neurons and edges can correspond to inter-layer connections. The generated graph representation can be provided to the modification module 116 to iteratively perform the following: 1) rewire the neuron connections in the baseline graph to compensate for detected degradation of one or more cells 101A-101E in the DNN 108, 2) determine characteristics of the DNN, and 3) select new values of weights p∈ [0, 1]. The modification module 116 can process all values of p and profiles of each memory cell in the DNN 108 and can transmit the network configuration to the DNN output module 106, which can configure the properties of DNN 108.

The DNN 108 can include multiple layers, such as an input layer, at least one hidden layer, and an output layer. The layers of the DNN 108 can be connected one by one. For example, the input layer can include a first neuron layer, and at least one hidden layer includes a second neuron layer to a (L−1)-th neuron layer, and the output layer includes a L-th neuron layer. For example, the input layer can transmit the received input data to the at least one hidden layer, the at least one hidden layer can perform layer-by-layer calculation conversion on the input data and sends the input data to the output layer, and the output layer outputs the output result of the neural network.

Two adjacent neuron layers of the DNN 108 can be connected by the memory array 102 acting as a weight parameter network. For example, the weight parameter can be selected to compensate for a degradation of one or more memory cells 101A-101E, by using adjusted conductance values to be written to the degraded one or more memory cells 101A-101E of the memory array 102. The weight parameters can be mapped to the conductance values of the memory array 102 according to one or more rules. For example, a difference between conductance values of two memory cells 101A-101N can also be used to represent a weight parameter. A mapping the weight parameters to the conductance values of the memory array 102 according to a degradation compensation rule is described as an example and is not a limitation on the present disclosure.

The example system 100 can be configured to detect memory cell degradation (e.g., degradation (aging) related degradation) of (a selected portion of) the memory cells 101A-101E, which can degrade the performance of the memory array 102 and of the accuracy of DNN 108, during each training period (epoch). In some implementations, degradation can be generated by a manufacturing process, wherein the memory cells are configured as nanoscale devices and the fabrication process can lead to large process variation. The fabrication process can result in large variation in memory cell parameters. For example, the maximum resistance, $R_{off}$ and the minimum resistance, $R_{on}$ values of memory cells 101A-101N can vary between each other. The conductance values of a memory cells 101A-101N can be tuned or programmed frequently to store the corresponding weight value and a high voltage is applied across the memory cell during the tuning. Frequent high voltage and high current across the memristor filament of the memory cells 101A-101N can change the internal structure of the memory cells 101A-101N by increasing temperature in the filament region. The repeated switching can reduce the range of conductance values of the memory cells 101A-101N and the number of conductance states. The decrease in maximum resistance $R_{off}$ of the memory cell can cause a loss in conductance levels with time. For example, a degraded memory cell 101A-101N that can be programmed to a maximum initial resistance level (e.g., 5) in a pristine state can only be programmed to an intermediate resistance level (e.g., 3) after a period of time t. Even after repeatedly trying to reprogram the degraded memory cell, the resistance value cannot exceed the degraded R resistance value. Ignoring the degradation characteristics of the memory array 102 including the degraded R resistance value of the degraded memory cell 101A-101E can result in wrong weight values stored in the memory array 102. As the degradation induced error propagates through the whole memory array 102 during computation, the accuracy of the DNN 108 can be drastically affected and the memory array 102 can degrade (age) faster than when the minimum resistance ($R_{on}$) is used.

The degradation detector 110 can detect, during training, the change of $R_{off}$ of the degraded memory cells 101A-101E as the memory array 102 degrades (ages) and the degradation extraction module 114 can model a degradation (aging) function. Incorporating the degradation (aging) function in an ideal memristive deep neural network (MDNN) can increase an accuracy of the DNN 108 affected by degradation of the memory array 102.

To model degradation (aging), the DNN 108 can be defined using a deep learning framework (e.g., namely PyTorch). The weights $g_{i,j}$ of the neural network can depend on minimum $W_{min}$ and maximum $W_{max}$ weight values of a layer of the DNN 108, the maximum conductance value of the memristor device $g_{max}$ and the minimum conductance value of the memristor device $g_{min}$. The weights $g_{i,j}$ of the neural network can be linearly scaled into conductance values of the memory array 102 using the following equation:

$$g_{i,j} = \frac{(W_{i,j} - W_{min}) * (g_{max} - g_{min})}{(W_{max} - W_{min})} + g_{min}$$

The generated conductance values represent the weights $g_{i,j}$ of the MDNN equivalent model. The model can be tuned by the degradation extraction module 114 and the modification module 116 to account for the changed weight values during linear scaling by using linear regression on the generated output and the desired output for a randomly produced input. The resulting model can include network characteristics that correspond to an ideal MDNN.

Non-ideality degradation (aging) was modeled in the ideal MDNN by using the proposed function as illustrated in Table 1. The degradation (aging) function assumes that the $R_{off}$ values of a memory cell 101A-101N decreases with time and causes the number of conductance levels to drop. Once the number of levels decreases, the percentage of memory cells 101A-101E which cannot be programmed beyond $R_{off}$ value increases. Input to the degradation (aging) function can be the value of maximum resistance value that decreases as a function of time (number of writing operations) and the percentage of memory cells 101A-101E that become degraded, being unable to be programmed beyond $R_{off}$ value increases. Each memory cell in the memory array 102 degrades (ages) at a different rate (e.g., depending on manufacturing characteristics and other factors). The model is configured to consider parametric details of each memory cell 101A-101E separately to ensure accurate degradation (aging) rate for each cell.

Table 1 shows an example algorithm describing the degradation (aging) function used to determine the degradation of a memory array 102. The conductance matrix of the ideal MDNN can be changed to incorporate the updated resistance values due to degradation (aging). For testing a model of the memory array 102 simulating that not all memory cells 101A-101N degrade (age) at a similar rate, different degradation rates (severe, moderate, and undegraded) were randomly selected across the memory array 102. The resultant is an MDNN model with degradation (aging).

TABLE 1

Func degradation (aging)($R_{age}$, device_aged, conductance_matrix):
    g_min = 1/$R_{age}$
    length = len(conductance_matrix)
    num_select = length * device_aged
    idx = random (1, length, num_select)
    for i in idx:
        conductance_matrix[i] = g_min
    return conductance_matrix
      A degraded (aging-affected) memory cell 101A-101E
      has a lower resistance $R_{age}$ than the resistance value of a new undegraded memory cell (maximum resistance) $R_{max}$. The degradation detector 110 can include a scanning mechanism (e.g., current scanner) that checks the $R_{age}$ value of each of the memory cell scheduled to be written using a value exceeding a set threshold (e.g., corresponding to state 3 or 4 shown in FIG. 1B). The degradation detector 110 can determined that a memory cell 101N, is undegraded if the $R_{age}$ is equal to the $R_{max}$. The degradation detector 110 can determined that a memory cell 101A-E is degraded if the $R_{age}$ is smaller than the $R_{max}$. The degradation detector 110 can determine a degradation level (e.g., age index), for each degraded memory cell based on the determined resistance value variation, delta expressed as the difference between $R_{age}$ and R_max_new.

The degradation detector 110 can transmit the degradation level to the degradation extraction module 114 to prevent increased write latencies that can be associated with memory cell verification, degradation verification can be limited to the memory cells on which data is planned to be written and that can get mapped to high resistance states. For example, as shown in FIG. 1B, a new undegraded memory cell can store four distinct values 124A-D as four distinct resistance states $R_{off}$, $R_2$, $R_1$, $R_{on}$. If a memory cell is selected to store a value 124A, B corresponding to one of the highest two resistance states $R_{off}$, $R_2$, the memory cell can be checked for potential degradation to confirm its ability to store the selected value by being undegraded or only moderately degraded. During verification, states 4 and 3 are mapped to the memory cell to perform a read post write and compare the read value against a set threshold voltage. If the stored value is equal to the value requested to be written, the memory cell is undegraded, otherwise it is determined as being a degraded memory cell.

If the current through the filament is decreased, then degradation (aging) also decreases. The example system 100 can be configured to adjust the total current applied to each memory cell 101A-101N to reduce the effect of degradation, for example by using sinusoidal pulses of a decreased frequency, as programming voltage, instead of DC voltage, such that the average current is reduced. The example system 100 can be configured to reduce (or avoid applying) the current across a memory cell to counter degradation, using a training scheme for neural networks including a skewed weight training.

The modification module 116 can be configured to apply skewed weight training by concentrating the weight values to a smaller value during training. Training of DNN 108 can be performed using a software simulated training, and the weights can be linearly mapped into the conductance of the memory array 102 (memristor crossbar). If the parameter update (e.g., weight value) of degraded memory cells is reduced, it can result in lower conductance values and high resistance values. High resistance can mean that less current can flow through the degraded memory cell 101A-101E to reduce the advance of degradation. The skewed weight training can be incorporated to generate a DNN model which can be converted into a MDNN using a simulator (e.g., MemTorch). Then effect of degradation (aging) on a skewed weight trained memory array (memristive) model can be studied using a degradation (aging) function.

Skewed weight training includes concentrating the weights to a smaller region while training the model. Skewed weight training can reduce the variance of the weight distribution graph. Training of a fully connected neural network includes a forward and a backward propagation. In forward propagation, the provided input is multiplied with weight values and intermediate variables are calculated in forward direction that is from input layer to output layer and finally output is generated. First step is to multiply weight vector (W1) for an input vector (X).

$z = W^1 X$

Second step is to pass the generated output through an activation function ø.

$h = \emptyset(Z)$

The generated output serves as input for the next layer where both steps are repeated till output layer is reached.

In backward propagation, weight values are reassigned moving backward from output layer to input layer. The generated output (zi) after forward propagation can be compared with the expected output (yi) to calculate loss using a loss function.

$L = \text{cost}(z_i, y)$

The gradient of a weight function with respect to weight function is calculated for each weight value in a layer $W_{ij}^k$ where k is the layer.

$$\text{gradient} = \delta L / \delta W_{ij}^k$$

The gradient can be subtracted from the weight value at that layer to get the new weight value. The gradient can be back propagated till the input layer and all weights are updated An extra term can be added to the loss function, which increases the value of gradient and decreases the weight value. The updated loss L can be represented as a function of the weight value $W_{ij}^k$ for $k^{th}$ layer and is the reference weight $W^{k'}$ for $k^{th}$ layer, around which the weights are skewed:

$$L = \text{cost}(z_i, y_i) + \text{skew}(W_{ij}^k, W^{k'})$$

The reference weight can be selected in the range of weights of the model and the weight distributions can be skewed around the reference weight. Original weight values that lie in the left and right side of the reference weight can be penalized using the the penalty factors $\lambda_1$, $\lambda_2$ for the weights on the left and right side of reference weight respectively:

$$\text{skew}(W_{ij}^k, W^{k'}) = \begin{cases} \sum_{k=1}^{no.\ of\ layers} \lambda_1 \cdot \|W^k - W^{k'}\|^2 & \text{when } W^k < W^{k'} \\ \sum_{k=1}^{no.\ of\ layers} \lambda_2 \cdot \|W^k - W^{k'}\|^2 & \text{when } W^k > W^{k'} \end{cases}$$

The updated loss function can be used to calculate the weight values to make the weight distribution graph skewed around the reference weight.

The skewed neural network model can be converted into a memristive model. Experiment results shown in FIGS. 5-10 indicate that the skewed memristive model outperforms the base model.

The experiments used as a simulator for designing a Memristive Deep Neural Network (MDNN). A Deep neural network (DNN) can include two 2D convolution layers and two linear layers that can be defined using PyTorch. The model was trained on a Modified National Institute of Standards and Technology (MNIST) dataset. A training accuracy of 99.25% and a testing accuracy of 99% was achieved for the DNN model. The memristor model considered for the experiment was defined as a base for generating the crossbar arrays. A voltage threshold adaptive memristor (VTEAM) model can be used with a threshold voltage of 0.2V, indicating a limit for any changes in the conductance values of a memory cell. The model parameters used for the VTEAM model are defined in Table 2.

TABLE 2

| Model | VTEAM |
| --- | --- |
| Device Length | 3 nm |
| $V_{threshold}$ | 0.2 V |
| Mapping Routine | Linear |
| Column | Double |
| ADC Resolution | 8 |

A test accuracy of 98.46% was obtained when the test dataset was executed on the ideal MDNN model. A simulation framework for memristive deep learning systems (MemTorch) can model the non-ideal characteristics like device variability, nonlinear device characteristics, device failure, and the number of conductance states. The MemTorch framework can be extended by modeling the degradation (aging) of memristors.

Figure 2:
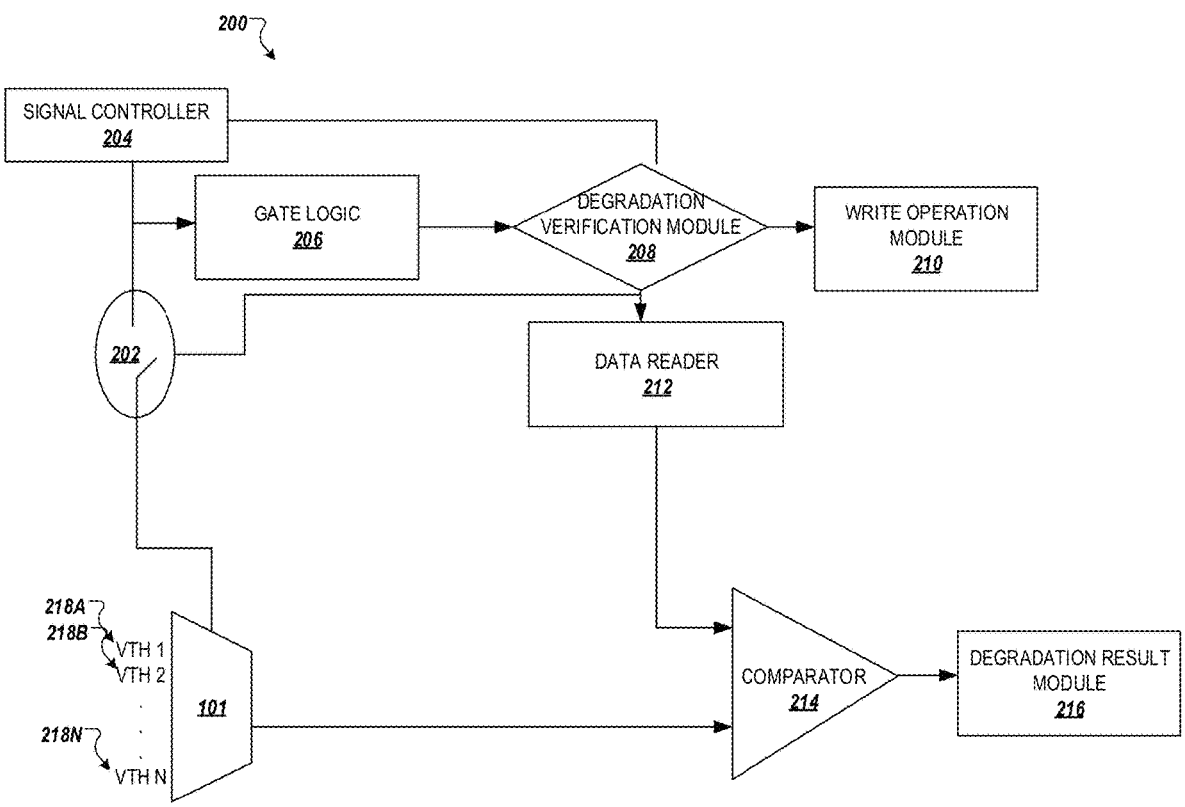
FIG. 2 depicts a diagram illustrating writing operations compensating for degradation, in accordance with some example implementations

FIG. 2 illustrates a diagram of an example circuit 200 to detect degradation of a memory cell 101 and to write operations on the memory cell 101. The example circuit 200 includes a switch 202, a signal controller 204, a gate logic 206, a degradation verification module 208, a write operation module 210, a data reader 212, a comparator 214, and a degradation result module 216.

The switch 202 can be used to selectively trigger an operation (writing or reading operation). The signal controller 204 can generate a control signal that can be sent to the write operation module 210 to indicate what data to write onto the memory cell 101. The control signal is used, by the degradation verification module 208, to first infer if the memory cell 101 is selected for high resistance value storage and is selected to be checked for degradation. For example, the control signal is used, by the degradation verification module 208, to identify whether the state of the memory cell 101 is selected for corresponds to the high resistance states that were chosen for the verification process (e.g., state 4 and 3 described with reference to FIG. 1B). If it is determined, by the degradation verification module 208, that degradation verification of the memory cell 101 is requested, the write operation module 210 can be triggered to write testing data or it is identified if data was previously written. The write operation module 210 can include a write logic that minimizes the number of writing operations to minimize the degradation process. The data written, by the write operation module 210 is read, by the data reader 212. The read data is compared, by the comparator 214 to a set threshold (VTH1, VTH2 . . . VTHN) 218A-218N. The number of thresholds can depend on the number of high resistance states that are choosen for degradation check. The control signal can be used, by the degradation verification module 208, to select the threshold voltage (VTH1, VTH2, . . . , VTHN) 218A-218N. The comparator 215 can send the comparison result to the degradation result module 216 to generate a degradation result. The degradation result can be used as feedback for future mappings to the memory cell 101.

Figure 3:
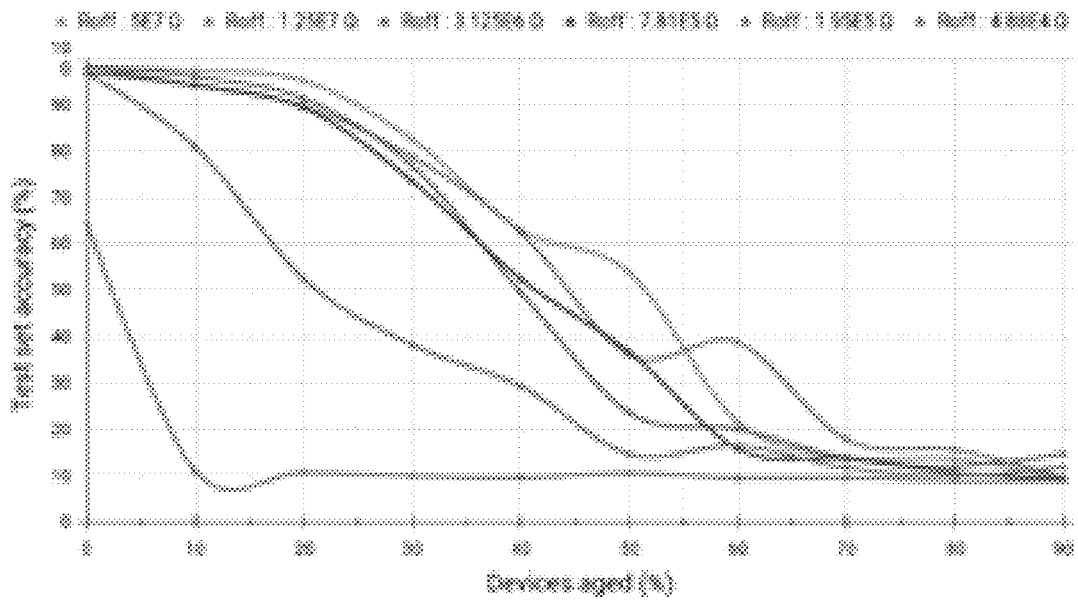
FIG. 3 depicts accuracy of degradation testing, in accordance with some example implementations.
Figure 4:
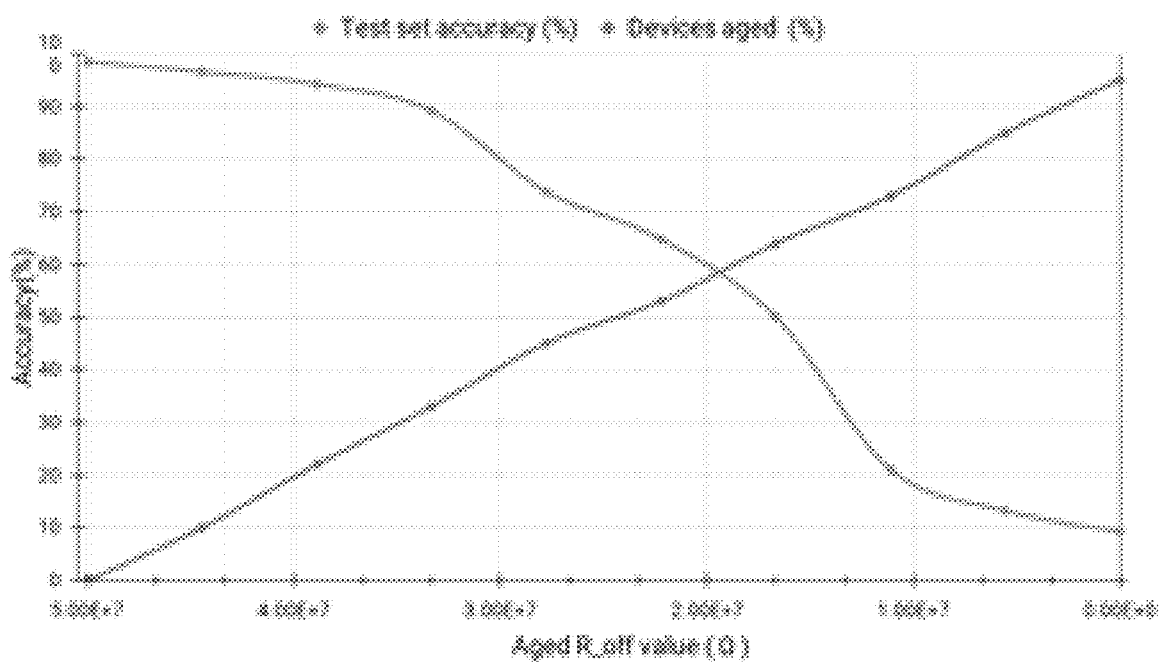
FIG. 4 depicts accuracy of degradation thresholding, in accordance with some example implementations.

FIGS. 3 and 4 illustrate testing results of a MDNN model (using the model parameters included in Table 3) with the incorporated degradation (aging) function. The degradation (aging) function was tested on the test dataset for different values of Raw and different percentages of degradation (aging).

TABLE 3

| Model | VTEAM |
| --- | --- |
| Device Length | 3 nm |
| Vthreshold | 0.2 V |
| Mapping routine | Linear |
| Column | Double |
| R_off | 5e7 ohms |
| R_on | 1.4e4 ohms |

FIG. 3 illustrates a case where $R_{off}$ was aged exponentially and for every value of $R_{age}$, the degradation (aging) percentage was increased linearly. FIG. 3 shows that as more and more memory cell degrades (ages) the accuracy decreases significantly. The decrease in accuracy as degradation (aging) increases when the R-value is lower. For example, the accuracy with R value set at 1.95E5 ohms decreased to around 50% when only 20% of devices were aged whereas the accuracy remained close to 98% when R was 5E7 ohms. The value of $R_{on}$ or minimum resistance was kept the same for all the cases. A decrease in the difference between maximum and minimum resistance can make the effect of degradation (aging) more significant because the number of conductance states of a memristor device is bounded by $R_{off}$ and $R_{min}$. If the difference between $R_{off}$ and $R_{min}$ is small, the memory array has a smaller number of conductance states. As degradation (aging) affects the $R_{off}$ value, a degraded memory array can have even fewer conductance states and the DNN accuracy can be adversely affected.

FIG. 4 illustrates a case where $R_{off}$ was aged linearly and as the value of R decreases, the degradation (aging) percentage was increased. The linear resistance value variation represents a more realistic simulation as when a memory cell degrades (ages), the value of R decreases and with time more and more memory cells can degrade (age). As R value decreases, the degradation (aging) percentage was selected randomly between 8-12% to observe a gradual degradation in performance with degradation (aging). The crossbar array was then updated to reflect the degraded (aged) behavior of memory cells and was tested on a test dataset. The test was then repeated till the percentage of degradation (aging) reached 100%. FIG. 4 shows the graph obtained for the described experiment. The graph shows that as memory cell degrades (ages), the accuracy decreases because, degradation (aging) changes the value of $R_{off}$ and decrease the number of conductance states. The weights stored in the memory array as conductance cannot reach the desired value. The generated error degrades the performance of DNN. The results prove that accuracy of a deep neural network is significantly affected by memory cell degradation. FIGS. 5-11 present details of the proposed strategies to compensate for detected memory cell degradation.

FIGS. 3 and 4 show how incorporating degradation (aging) function, affects the performance of a neural network. To incorporate skewed weight learning during training, we designed a revised version of the Adam algorithm, where the loss function was implemented. The reference weight was selected to be a factor of the standard deviation of the original initialized weight for each layer:

$$W^*=\sigma \sigma_j * \text{delta\_scale}.$$

The delta_scale represents the factor with which standard deviation was multiplied to obtain the reference weight. The different values of $\lambda_1$, $\lambda_1$ and delta_scale that were considered to find the best-suited value with no performance degradation with training a neural network with skewed weight shown in FIGS. 3 and 4 are included in Table 4.

TABLE 4

| | |
|---|---|
| $\lambda_1$ | 0, 1, 0.5, 0.1, 0.08, 0.05, 0.01, 0.005, 0.001 |
| $\lambda_2$ | 0, 1, 0.5, 0.1, 0.08, 0.05, 0.01, 0.005, 0.001 |
| delta_scale | 0.75, 1, 1.5, 2, −0.75, −1, −1.5, −2 |

Figure 5A:
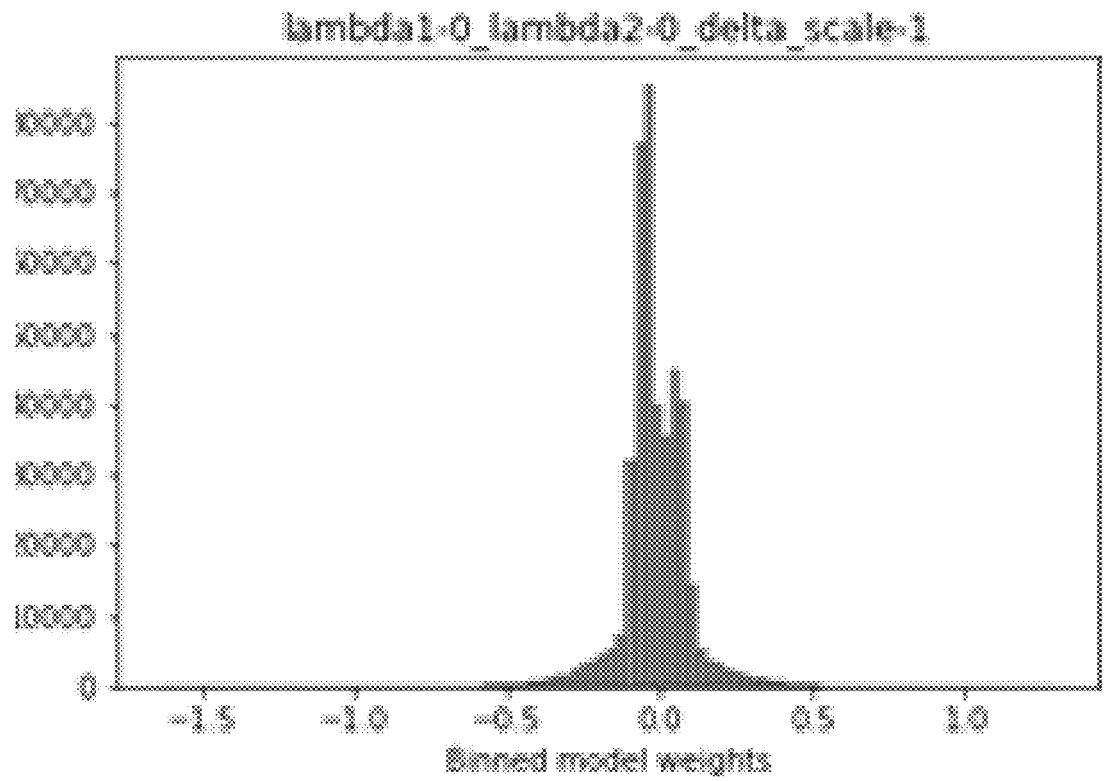
FIGS. 5A and 5B depict examples of weight distribution graphs, in accordance with some example implementations.
Figure 5B:
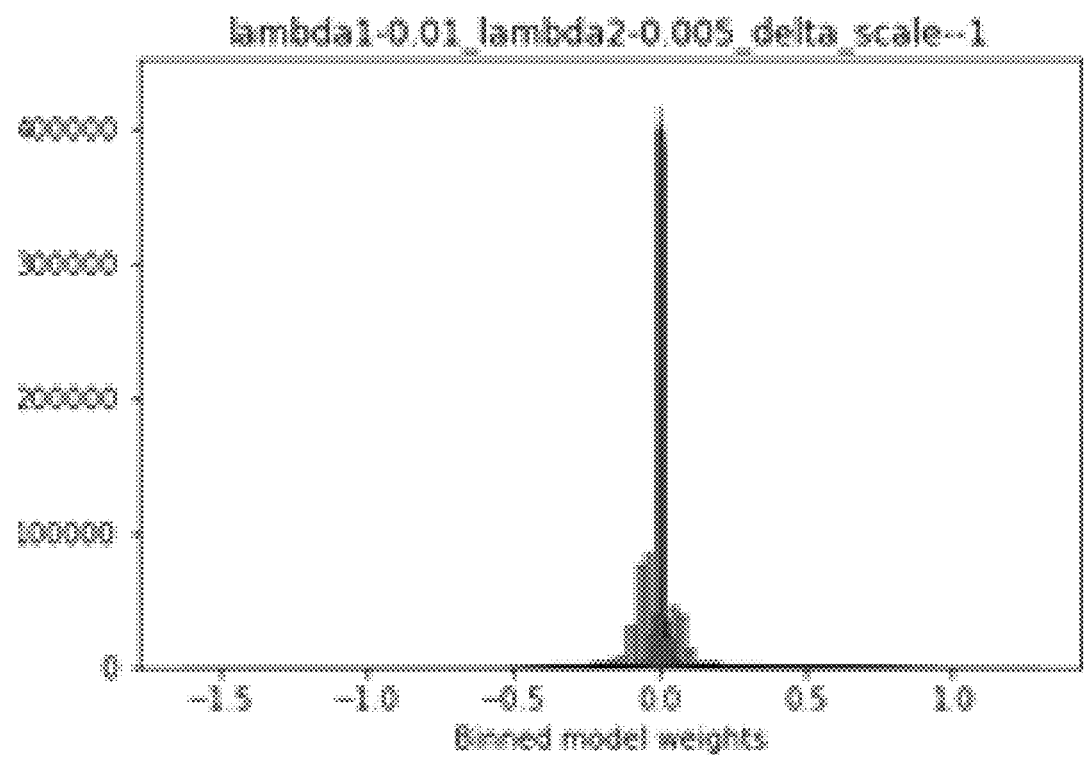

FIGS. 5A and 5B show examples of weight distribution graphs generated using a PyTorch model without skewed weight training and after skewed weight training respectively. In FIG. 5A the variance of weight distribution is higher than in FIG. 5B, where skewed weight training is implemented, indicating that the skewed weight training results in weights being skewed around the reference weight.

Figure 6:
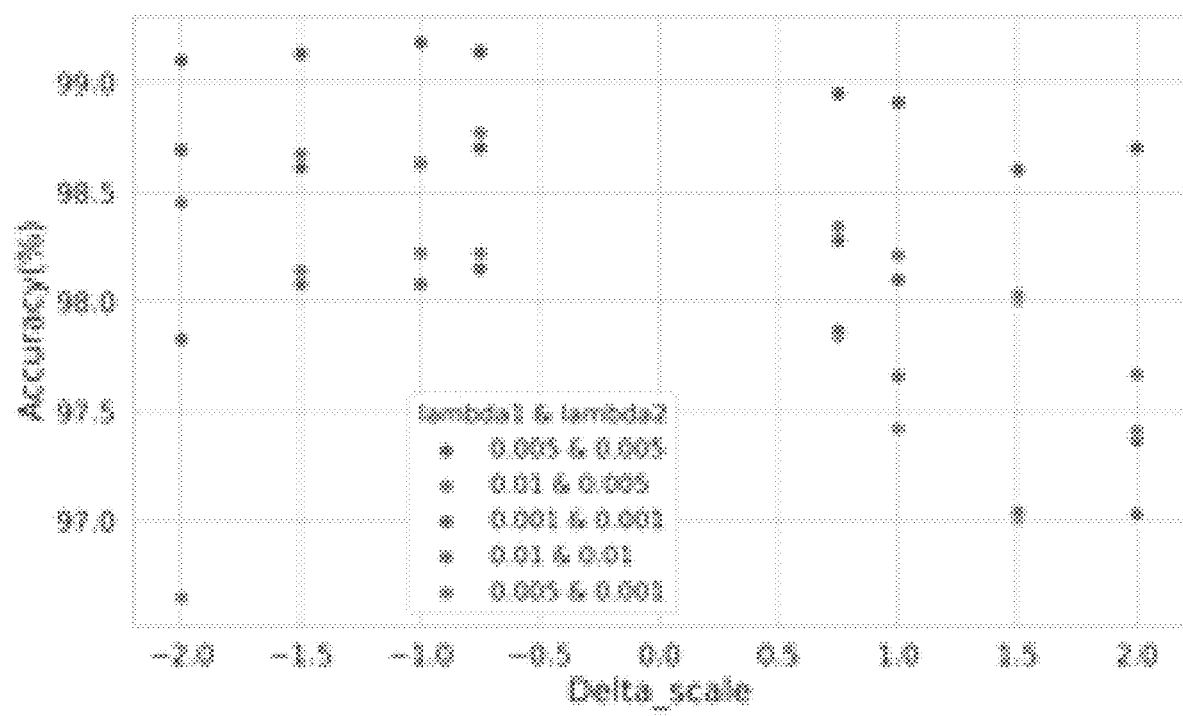
FIG. 6 depicts an example of scatter plot indicating accuracy for delta scales, in accordance with some example implementations.

FIG. 6 shows an example of a scatter plot for different values of $\lambda_1$, $\lambda_2$ and delta_scale, where delta_scale represents the factor with which standard deviation was multiplied to obtain the reference weight, were considered to find the best range for which the weight values can be skewed without compromising on the accuracy. It can be observed from FIG. 6 that lower value of $\lambda_1$ and $\lambda_2$ gives better accuracy. When $\lambda_1$ and $\lambda_2$ are 0.001, the accuracy is above 99% which is comparable with the accuracy of an unskewed model. Whereas $\lambda_1$ and $\lambda_2$ was increased to 0.01, the accuracy dropped below 98%. The higher values $\lambda_1$ and $\lambda_2$ means more penalization or increased loss value that can increase the gradient and decrease the weight value. As weight value decreases, the learning during forward propagation can be affected which can result in less accuracy. The accuracy can be better when the delta-scale is in between −1 to 0.75 e.g., in the middle region. This is because the weight distribution follows a nearly normal distribution curve. And in a normal distribution majority of value (around 68%) is located in between (−1*σ) and (1*σ). As delta_scale represents the factor with which standard deviation was multiplied to obtain the reference weight, the performance of the model can be better when the reference weight is selected to be in the 68% range.

Figure 7A:
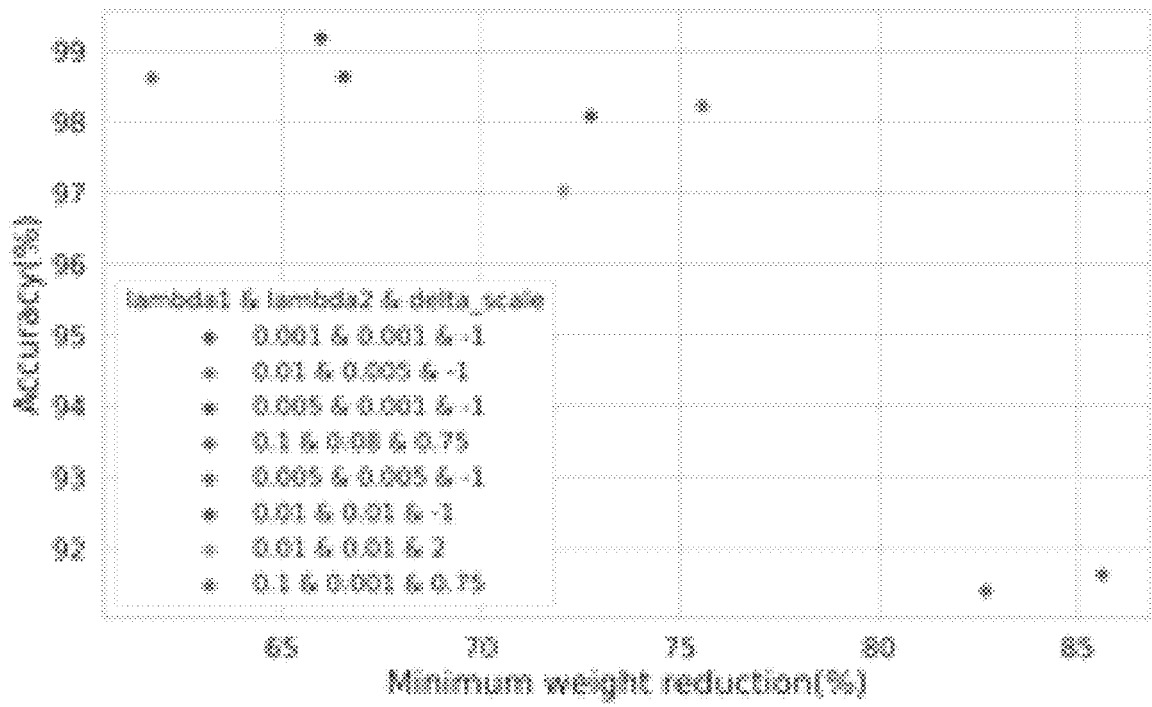
FIGS. 7A and 7B depict examples of scatter plot indicating accuracy for different minimum weight reductions, in accordance with some example implementations.
Figure 7B:
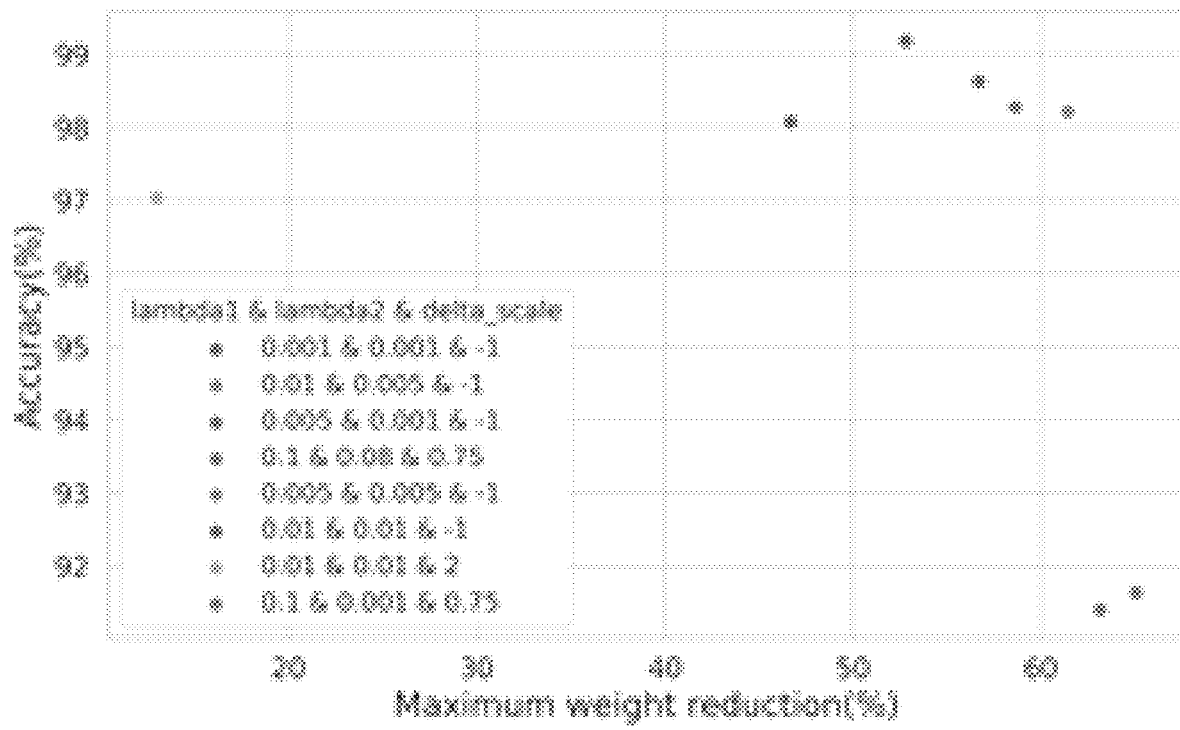

FIGS. 7A and 7B show accuracy as function of parameter updates including weight reduction. FIGS. 7A and 7B show how weight reduction can affect the reduction in minimum and maximum weight values or variance of the weight distribution graph. FIGS. 7A and 7B show the plot of accuracy versus a reduction in minimum and maximum weight for different values of $\lambda_1$, $\lambda_2$ and delta_scale in a skewed weight trained model. The higher value of $\lambda_1$, and $\lambda_2$ can result in the maximum percentage of reduction in weight values but at the cost of accuracy. When $\lambda_1$, $\lambda_2$ values are set at 0.1 and 0.08, around 85% reduction in minimum weight value was observed but accuracy was only 91.64% because higher $\lambda_1$ and $\lambda_2$ mean weights can be penalized with a higher value and thus, more weights can be skewed around the reference weight.

The model can be trained for different values of $\lambda_1$, $\lambda_2$ and delta_scale to find the best tradeoff between accuracy and skewed percentage as shown by the results included in Table 5. The best range of $\lambda_1$, $\lambda_2$ and delta_scale can reduce the minimum and maximum weight value without significant compromise on accuracy, as was found to be $\lambda_1$=0.01, $\lambda_2$=0.005 to 0.001 and delta_scale=−1. Also, for $\lambda_1$>0.1 and $\lambda_2$>0.08, the model performs very poorly.

TABLE 5

| $\lambda_1$ | $\lambda_2$ | delta_scale | Max_weight reduction % ge | Min_weight reduction % ge | Accuracy |
|---|---|---|---|---|---|
| 0.001 | 0.001 | −1 | 32.8% | 46.8% | 99.18% |
| 0.01 | 0.005 | −1 | 52% | 61.4% | 98.22% |
| 0.1 | 0.08 | 0.75 | 65% | 85% | 91.64% |

The skewed weight training can reduce conductance value across memory cells to reduce the current and hence slow down degradation (aging). The skewed weight trained neural network model can be converted into a memristive model resulting in a skewed weight-trained MDNN. The proposed degradation (aging) function can be applied to the MDNN and a test dataset can be used to see the effect of degradation (aging) on the skewed weight-trained memristive model.

Figure 8:
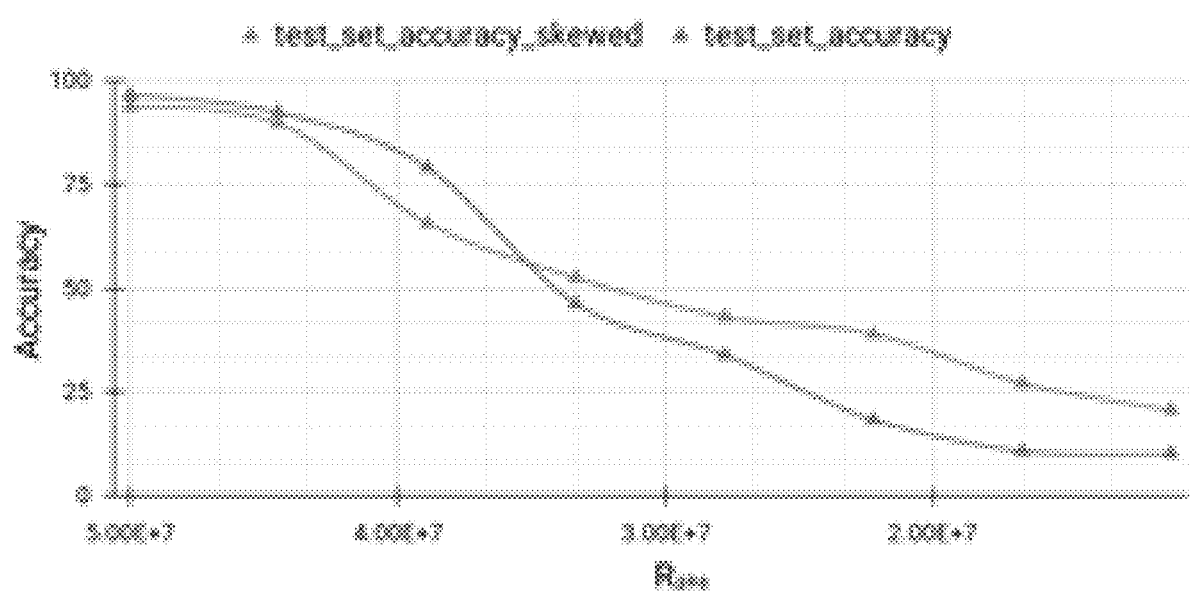
FIG. 8 depicts examples of effect of degradation (aging) on skewed weight trained model and traditional weight trained model, in accordance with some example implementations.

FIG. 8 illustrates effect of aging on a skewed weight trained MDNN and a traditional weight trained MDNN. The effect of degradation (aging) on the skewed weight trained MDNN and a traditional weight trained MDNN can be compared. If all memory cells are undegraded, the accuracy achieved by the skewed weight trained model can be substantially the same as the traditional model accuracy. But as the memory array degrades, the decrease in accuracy of the unskewed model is steeper than the skewed model. When around 50% of memristor is degraded, the skewed memristor model shows around 10% more accuracy than unskewed model. The skewed weight training leads to 25% slowdown in degradation (aging) due to decrease in amount of current across the memory cell, which slows down the process of degradation (aging).

Figure 9:
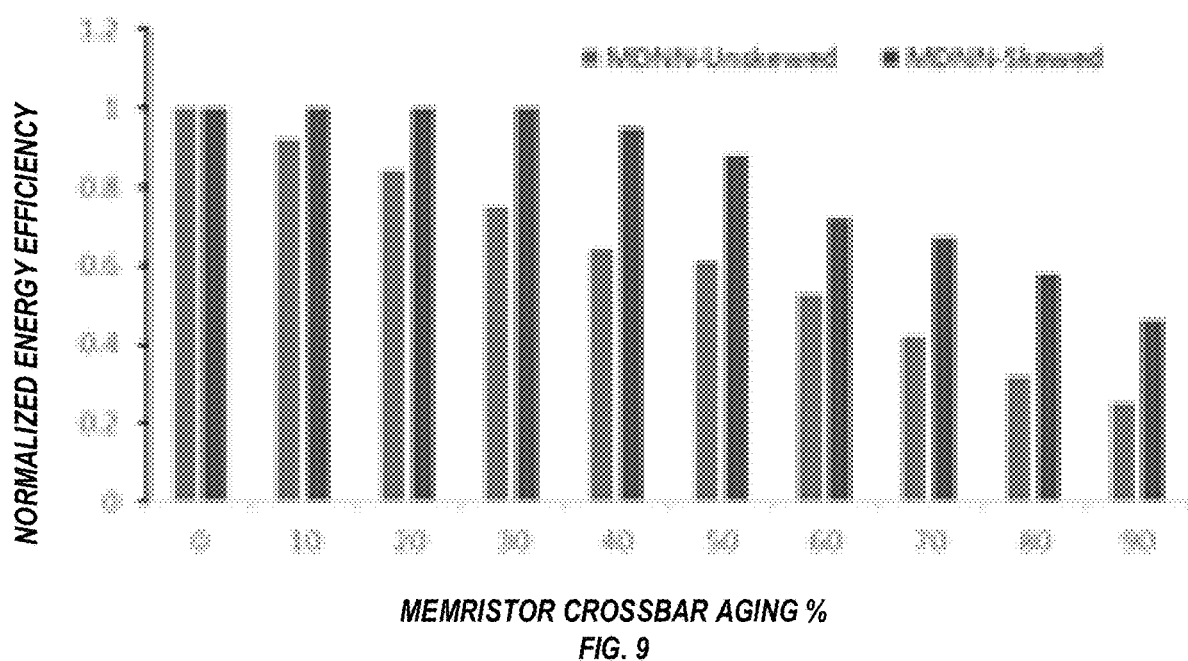
FIG. 9 shows normalized energy efficiency comparison of MDNN-Unskewed versus MDNN-Skewed memristor crossbar degradation (aging), in accordance with some example implementations.

FIG. 9 shows a normalized energy efficiency comparison of MDNN-Unskewed versus MDNN-Skewed memristor crossbar degradation (aging) %. The energy efficiency MDNN-Unskewed can be compared to MDNN-Skewed memristor crossbar degradation (aging) %, normalized to energy-efficiency of Unskewed-MDNN at 0% degradation (aging). The energy-efficiency of unskewed-MDNN degrades with degradation (aging) as the aged memory cells draw more current. With Skewed-MDNN, even after 40% degradation (aging), the adapting training mechanism adjusts the current values of aged memory cells. The energy efficiency remains almost identical to the 0% aged value.

Figure 10A:
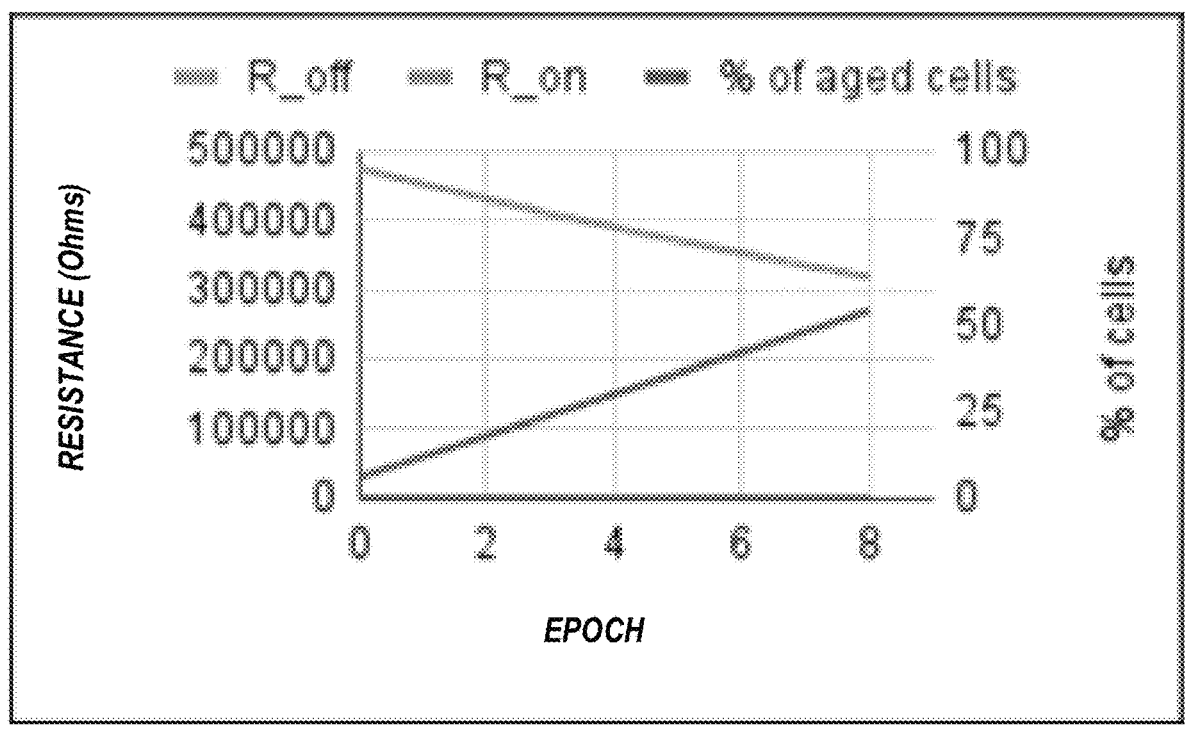
FIGS. 10A and 10B illustrate changes over degradation epochs, in accordance with some example implementations.
Figure 10B:
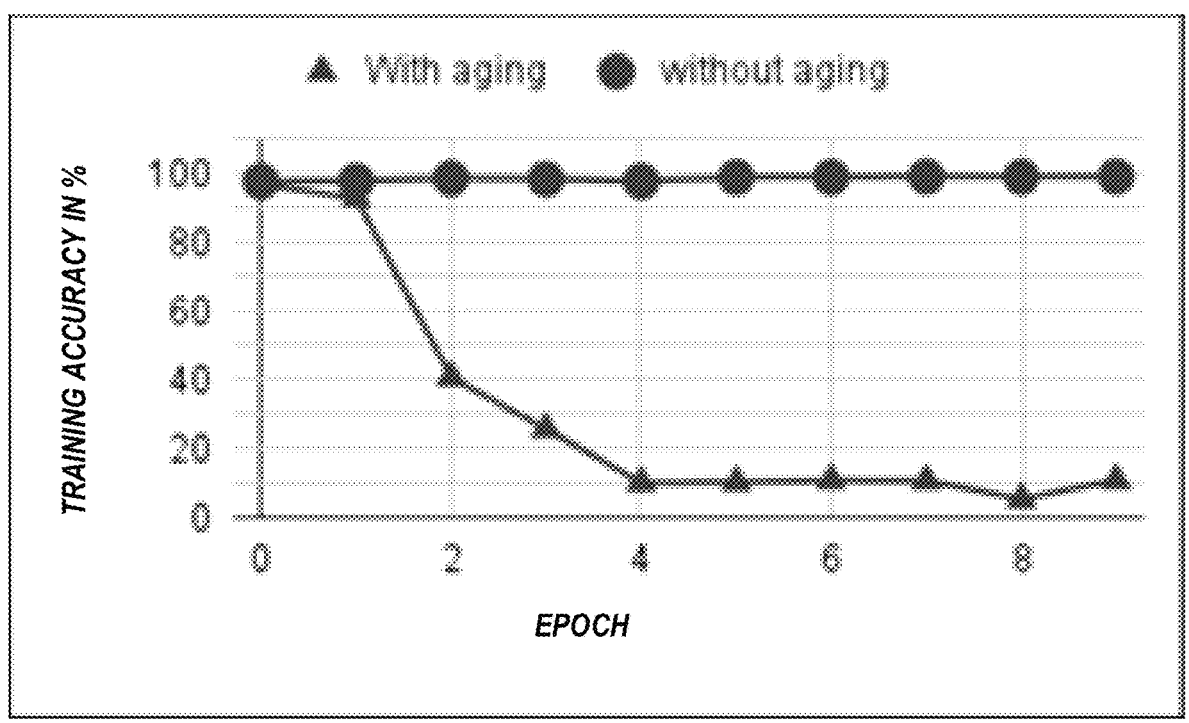

FIGS. 10A and 10B illustrates changes during multiple training epochs. FIG. 10A shows the distribution of the R_off and R_on values during the training phase and also the rate of increase of the number of aged cells in the crossbar. FIG. 10B illustrates changes to training accuracy of the neural network model being affected due to non-compensated degradation. FIG. 10A shows the results of modelling degradation (aging) and training the MDNN to observe its effect on DNN accuracy and detection of degraded memory cells. A simulator can be used for designing a memristive deep neural network (MDNN). A deep neural network (DNN) with two convolutional layers and two linear layers can be defined using PyTorch. The PyTorch model can be used by the memtorch framework to map to a MDNN. The mapping is executed in every epoch to simulate the scenario of training of neural networks online on the crossbar arrays. The memristor model used as a base for generating the crossbar arrays can be the VTEAM model with a threshold voltage of 0.2V. The degradation (aging) is a non-ideal characteristic of memristor which can significantly degrade the performance of the memory array over time.

Figure 11:
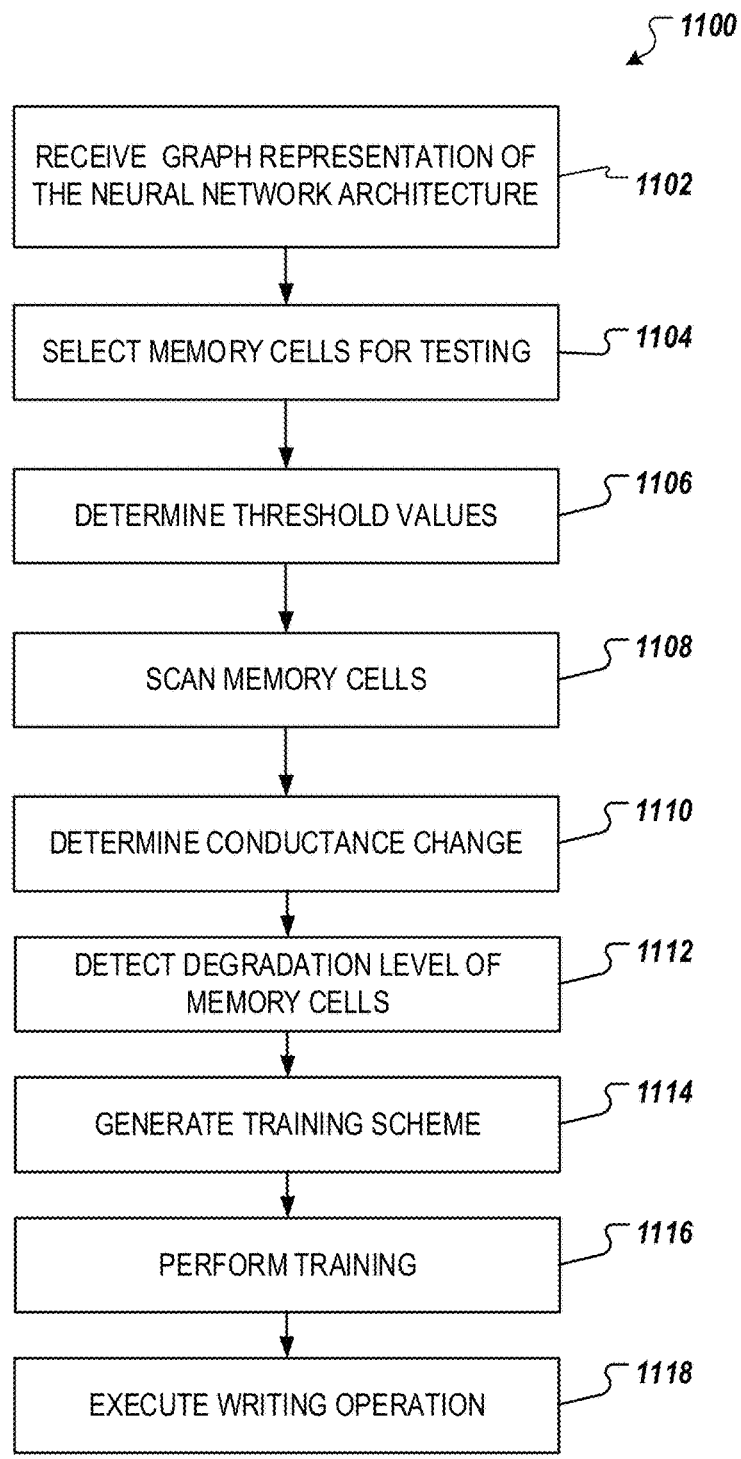
FIG. 11 depicts an example process, in accordance with some example implementations.

FIG. 11 depicts a flowchart illustrating an example process 1100 for compensating for memory cell degradation, in accordance with some example implementations. The example process 1100 can be executed by the example systems shown in FIGS. 1A, 1B, and 2, in any combination thereof. As memory cells are nanoscale devices, the fabrication process can lead to significant variation in parameters mainly, maximum resistance, $R_{off}$ and minimum resistance, $R_{on}$. The conductance values of a memory cell can be written (tuned or programmed) frequently to store the corresponding parameters (including the weights) value for connecting adjacent layers of a DNN. The writing process can also affect the properties of the memory cells, leading to degradation. A high voltage can be applied across the memory cell to write a selected conductance value. Frequent writing operations can reduce the range of conductance values (the number of conductance states) that can be written on a degraded memory cell because of the decrease in maximum resistance $R_{off}$ of the memory cell. The example process 1100 describes an adjustment based on the change of $R_{off}$ as memory cells age using a degradation (aging) function. Incorporating the example process 1100 can maintain the DNN accuracy of a deep learning model is affected by degradation (aging) of a memristor device.

At 1102, a graph representation of the neural network architecture can be generated based on the received description. The graph representation can include multiple layers. For example, the neural network architecture can include a deep neural network (DNN) with two convolutional layers and two linear layers. The layers can include one or more nodes connected by one or more connections, corresponding to a memory array including multiple memory cells. Each layer can include a minimum weight value $W_{min}$ and a maximum weight value $W_{max}$. The weight values of the nodes within a layer can vary between the minimum weight value $W_{min}$ and the maximum weight value $W_{max}$.

At 1104, one or more memory cells of the memory array are selected for testing based on conductance values. The conductance values corresponding to the parameter (including the weight) values of the layer nodes can generated and filtered to select the memory cells planned to be assigned conductance values exceeding a conductance (or resistance) value threshold requiring conductance value storage on undegraded or moderately degraded memory cells for correctly storing the conductance values.

At 1106, the threshold conductance (or resistance) values are determined. The threshold values can define cutoff values defining conductance (or resistance) value ranges of undegraded memory cells, moderately degraded memory cells, and severely degraded memory cells, as described with reference to FIG. 1B. For example, a new undegraded memory cell can store a set number (e.g., four) distinct values as distinct resistance states (e.g., $R_{off}$, $R_2$, $R_1$. $R_{on}$). If a memory cell is selected to store a value corresponding to one of the highest (one or two) resistance states (e.g., $R_{off}$, $R_2$) the memory cell can be selected to be checked for potential degradation to confirm its ability to store the planned value by being undegraded or by being only moderately degraded.

At 1108, the selected memory cells are scanned to detect potential degradations corresponding to particular locations within the memory array. The selected memory cells can be scanned using a scanning mechanism that checks the maximum actual resistance value $R_{age}$ of each of the memory cell. The scanning mechanism can include a current meter. If for a memory cell, the actual resistance value $R_{age}$ is equal to an original undegraded maximum resistance value $R_{max}$, the memory cell is determined as being an undegraded memory cell. If for a memory cell, the actual resistance value $R_{age}$ is smaller than the undegraded maximum resistance value $R_{max}$, the memory cell is determined as being a degraded memory cell. During verification, the highest (one or two) resistance states (e.g., $R_{off}$, $R_2$) can be mapped to the selected memory cell to perform a read post write and compare the read value against the set threshold value. If the stored value is equal to the value requested to be written, the memory cell is undegraded, otherwise it is determined as being a degraded memory cell. The actual resistance value can be converted to an actual maximum conductance value. To prevent increased write latencies that can be associated with memory cell verification, degradation verification can be limited to the selected memory cells on which data is planned to be written and are mapped to high resistance states.

At 1110, conductance value changes are determined for the selected memory cells. The conductance value changes can be determined as a difference between a (maximum or averaged) conductance value of an undegraded memory cell (or a previously stored conductance value) and an actual conductance value corresponding to the measured actual resistance value Rae. The variation of the conductance (or resistance) value over time can be used to identify a degradation rate (e.g., degradation change over time).

At 1112, degradation level is detected in one or more of the scanned memory cells identified as being degraded. The degradation level (age index) can be determined, for each degraded memory cell, as a difference to each of the set thresholds, to classify the memory cell as severely or moderately degraded.

At 1114, a training scheme for neural networks is generated. The training scheme can be tuned to account for the determined degradation and actual maximum conductance value that can be stored in the degraded memory cells, according to the determined classification. The training scheme can include changed parameter (including the weight) values during linear scaling by using linear regression on the generated output and the desired output for an input tuned to the degradation classification. The algorithm of the basic function of our model of degradation (aging) can use the proportion of degraded memory cells to undegraded memory cells and the resistance values the degraded memory cells can use as inputs and can randomly choose memory cells in the memory array in accordance with the proportion specified and can map the memory cells to the specified resistance value.

For example, the locations of the classified degraded memory cells, can be used to set a restriction on the maxima of the available resistance states (e.g., restrict the mappings to a more confined range of resistance values) and proceed with training the memory array so that the decrease in the highest allowable resistance value does not affect the performance of the neural network. The restriction can include an accuracy threshold of the classified degraded memory cells over which the accuracy decreases significantly. If the training of the number of classified degraded memory cells exceeds the accuracy threshold value, the number of allowable resistance states is adjusted by allocating a new maximum resistance value and training the memory array.

The parameters (including the weights) of the neural network can be linearly scaled into conductance values of the memory (memristor crossbar) array. For example, the weights $g_{i,j}$ of the neural network can depend on minimum $W_{min}$ and maximum $W_{max}$ weight values of the layer of the neural network, the maximum conductance value of the memristor device $g_{max}$ and the minimum conductance value of the memristor device $g_{min}$. The weights $g_{i,j}$ of the neural network can be linearly scaled into conductance values of the memory array 102 using the following equation:

$$g_{i,j} = \frac{(W_{i,j} - W_{min}) * (g_{max} - g_{min})}{(W_{max} - W_{min})} + g_{min}$$

The generated conductance values represent the weights $g_{i,j}$ of the equivalent memory array model. The model can be tuned to account for the changed parameter (including the weight) values during linear scaling by using linear regression on the generated output and the desired output for a randomly produced input.

At 116, training is performed using the training scheme tuned to account for memory cell degradation. Training of neural network can be executed using a model of the memory array with the detected degradation characteristics, for example by using a software application that considers parameters (including the weights) that are linearly mapped into the conductance of the memory array. Training of a fully connected neural network includes of a forward and a backward propagation. In forward propagation, the provided input is multiplied with parameter (including the weight) values and intermediate variables are calculated in forward direction that is from input layer to output layer and finally output is generated. The first step is to multiply a parameter (weight) vector with given input vector. The second step is to pass the generated output through an activation function to generate an output that serves as input for the next layer of the neural network, where both steps are repeated until the output layer is reached. In backward propagation, parameter (weight) values can be reassigned moving backward from output layer to input layer. The generated output after forward propagation is compared with the expected output to calculate loss using a loss function, as described with reference to FIGS. 1A and 1B. The gradient of parameter (weight) function with respect to the parameter (weight) function is calculated for each parameter (weight) value in each layer of the neural network. The gradient is subtracted from the parameter (weight) value at the respective layer to generate the new parameter (weight) value. The gradient can be back propagated until the input layer and all parameters (including the weights) are updated.

The training scheme for neural networks can include skewed parameter (weight) training that is done by reducing the parameter (weight) values to a smaller value during training such that the conductance values assigned to the degraded memory cells are below their respective maximum conductance values. The skewed parameter (weight) training includes reducing the parameters (e.g., weights) to a smaller region while training the model. The skewed parameter (weight) training can reduce the variance of the parameter (weight) distribution graph. A reference parameter (weight) can be selected in the range of parameter (weight) values of the model and the parameter (weight) distributions can be skewed around the reference parameter (weight). Original parameter (weight) values that lie in the left and right side of the reference parameter (weight) can be penalized. An updated loss function can be used to calculate the parameter (weight) values to make the parameter (weight) distribution graph skewed around the reference parameter (weight). The skewed neural network model can be converted into a memory array model that is configured to set differential writing operations to the memory cells based on their respective degradation classification.

At 118 a writing operation is executed according to the writing parameter values determined using the skewed parameter (weight) training. For example, the writing operation can be executed using first set of writing parameter values to the one or more degraded memory cells to compensate for the degradation of the one or more degraded memory cells and by applying the second set of writing parameter values to the undegraded memory cell. The first set of writing parameter values can include a decreased current through the filament of the degraded memory cells to increase the accuracy of the neural network and to prevent (minimize) additional degradation that can be induced by the writing operation. The first set of writing parameter values can include a characterization in terms of writing frequency, signal frequency, amplitude, and pulse width of sinusoidal pulses used as programming voltage for the memory cells during the writing operations, instead of DC voltage to reduce the average current applied to the degraded memory cells or to avoid applying a writing operation to one or more of the degraded memory cells. The writing operation scheme incorporates degradation level of each memory cells to adjust the conductance matrix and current values dynamically, thereby maintaining the accuracy of the neural network and the energy efficiency.

Figure 12:
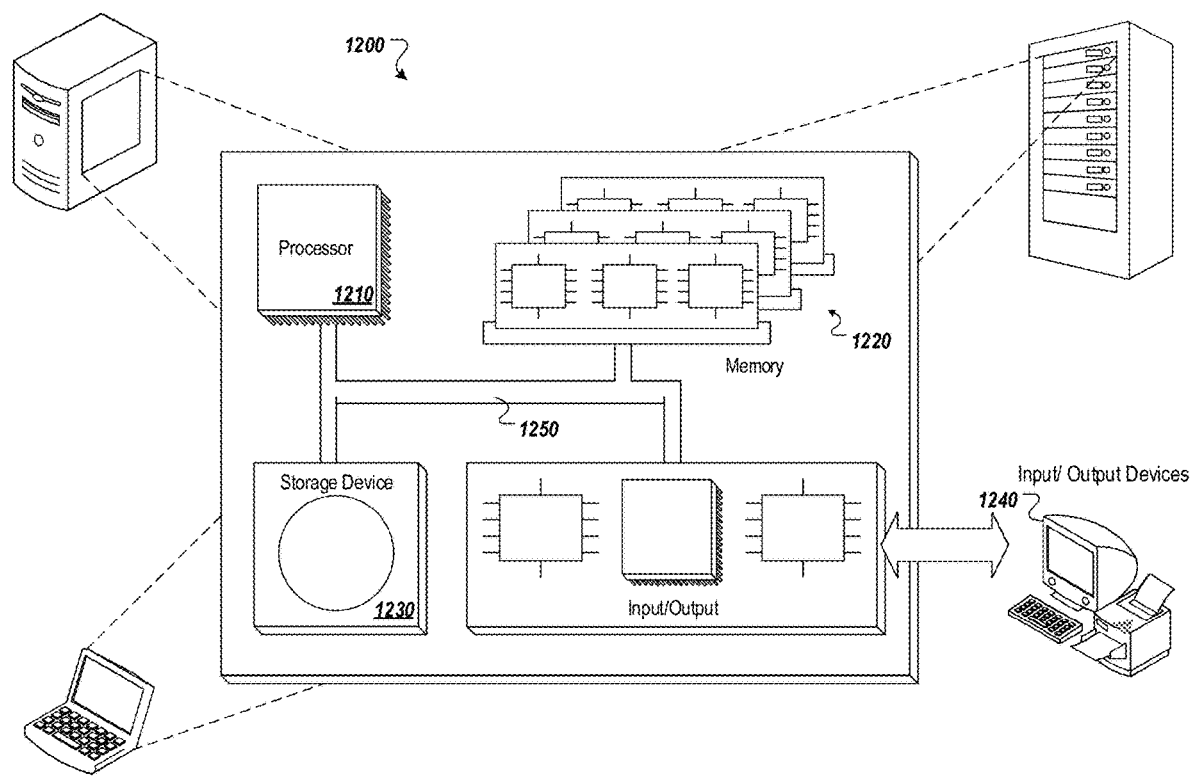
FIG. 12 depicts a diagram illustrating a computing system, in accordance with some example implementations.

FIG. 12 depicts a diagram illustrating a computing system, in accordance with some example implementations. In some implementations, the current subject matter can be configured to be implemented in a system 1200, as shown in FIG. 12. The system 1200 can include a processor 1210, a memory 1220, a storage device 1230, and an input/output device 1240. Each of the components 1210, 1220, 1230 and 1240 can be interconnected using a system bus 1250. The processor 1210 can be configured to process instructions for execution within the system 1200. In some implementations, the processor 1210 can be a single-threaded processor. In alternate implementations, the processor 1210 can be a multi-threaded processor. The processor 1210 can be further configured to process instructions stored in the memory 1220 or on the storage device 1230, including receiving or sending information through the input/output device 1240. The memory 1220 can store information within the system 1200. In some implementations, the memory 1220 can be a computer-readable medium. In alternate implementations, the memory 1220 can be a volatile memory unit. In yet some implementations, the memory 1220 can be a non-volatile memory unit. The storage device 1230 can be capable of providing mass storage for the system 1200. In some implementations, the storage device 1230 can be a computer-readable medium. In alternate implementations, the storage device 1230 can be a floppy disk device, a hard disk device, an optical disk device, a tape device, non-volatile solid state memory, or any other type of storage device. The input/output device 1240 can be configured to provide input/output operations for the system 1200. In some implementations, the input/output device 1240 can include a keyboard and/or pointing device. In alternate implementations, the input/output device 1240 can include a display unit for displaying graphical user interfaces.

In some implementations, one or more application function libraries in the plurality of application function libraries can be stored in the one or more tables as binary large objects. Further, a structured query language can be used to query the storage location storing the application function library.

The systems and methods disclosed herein can be embodied in various forms including, for example, a data processor, such as a computer that also includes a database, digital electronic circuitry, firmware, software, or in combinations of them. Moreover, the above-noted features and other aspects and principles of the present disclosed implementations can be implemented in various environments. Such environments and related applications can be specially constructed for performing the various processes and operations according to the disclosed implementations or they can include a general-purpose computer or computing platform selectively activated or reconfigured by code to provide the necessary functionality. The processes disclosed herein are not inherently related to any particular computer, network, architecture, environment, or other apparatus, and can be implemented by a suitable combination of hardware, software, and/or firmware. For example, various general-purpose machines can be used with programs written in accordance with teachings of the disclosed implementations, or it can be more convenient to construct a specialized apparatus or system to perform the required methods and techniques.

Although ordinal numbers such as first, second, and the like can, in some situations, relate to an order; as used in this document ordinal numbers do not necessarily imply an order. For example, ordinal numbers can be merely used to distinguish one item from another. For example, to distinguish a first event from a second event, but need not imply any chronological ordering or a fixed reference system (such that a first event in one paragraph of the description can be different from a first event in another paragraph of the description).

The foregoing description is intended to illustrate but not to limit the scope of the invention, which is defined by the scope of the appended claims. Other implementations are within the scope of the following claims.

These computer programs, which can also be referred to programs, software, software applications, applications, components, or code, include machine instructions for a programmable processor, and can be implemented in a high-level procedural and/or object-oriented programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as can a non-transient solid state memory or a magnetic hard drive or any equivalent storage medium. The machine-readable medium can alternatively or additionally store such machine instructions in a transient manner, such as for example as can a processor cache or other random access memory associated with one or more physical processor cores.

To provide for interaction with a user, the subject matter described herein can be implemented on a computer having a display device, such as for example a cathode ray tube (CRT) or a liquid crystal display (LCD) monitor for displaying information to the user and a keyboard and a pointing device, such as for example a mouse or a trackball, by which the user can provide input to the computer. Other kinds of devices can be used to provide for interaction with a user as well. For example, feedback provided to the user can be any form of sensory feedback, such as for example visual feedback, auditory feedback, or tactile feedback; and input from the user can be received in any form, including, but not limited to, acoustic, speech, or tactile input.

The subject matter described herein can be implemented in a computing system that includes a back-end component, such as for example one or more data servers, or that includes a middleware component, such as for example one or more application servers, or that includes a front-end component, such as for example one or more user device computers having a graphical user interface or a Web browser through which a user can interact with an implementation of the subject matter described herein, or any combination of such back-end, middleware, or front-end components. The components of the system can be interconnected by any form or medium of digital data communication, such as for example a communication network. Examples of communication networks include, but are not limited to, a local area network ("LAN"), a wide area network ("WAN"), and the Internet.

The computing system can include user devices and servers. A user device and server are generally, but not exclusively, remote from each other and typically interact through a communication network. The relationship of user device and server arises by virtue of computer programs running on the respective computers and having a user device-server relationship to each other.

Further non-limiting aspects or implementations are set forth in the following numbered examples:

Example 1: A method comprising: detecting, during a training of a neural network, a degradation of one or more degraded memory cells of a memory array comprising a plurality of memory cells, at least a portion of the plurality of memory cells comprising an undegraded memory cell; determining, using a model of the memory array tuned to account for the degradation of one or more memory cells, a first set of writing parameter values to be applied to the one or more degraded memory cells and a second set of writing parameter values to be applied to the undegraded memory cells; and executing a writing operation, by applying the first set of writing parameter values to the one or more degraded memory cells to compensate for the degradation of the one or more degraded memory cells and by applying the second set of writing parameter values to the undegraded memory cell.

Example 2: The method of example 1, wherein the plurality of memory cells comprise resistive memory cells.

Example 3: The method of any of the preceding examples, wherein detecting the degradation of one or more degraded memory cells comprises: determining, using a degradation model, storing conductance values that are different from written conductance values.

Example 4: The method of claim 3, wherein the degradation model processes the plurality of memory cells using as input a value of maximum resistance and the written conductance values to generate a matrix of the storing conductance values.

Example 5: The method of any of the preceding examples, wherein detecting the degradation of one or more degraded memory cells comprises: scanning, using a current meter, a conductance value of each memory cell of the plurality of memory cells; and determining a conductance change by comparing the conductance value of each memory cell to a previous conductance value stored by a buffer.

Example 6: The method of any of the preceding examples, wherein the first set of writing parameter values and the second set of writing parameter values comprise a current, a voltage, a signal frequency or a pulse width.

Example 7: The method of claim 6, wherein the executing the writing operation, by applying the first set of writing parameter values to the one or more degraded memory cells to compensate for the degradation of the one or more degraded memory cells comprises reducing a writing amount to the one or more degraded memory cells by avoiding writing or by reducing the signal frequency or the pulse width.

Example 8: The method of any of the preceding examples, wherein the first set of writing parameter values and the second set of writing parameter values are determined using a skewed parameter (weight) training comprising normalizing parameter (weight) values of the one or more degraded memory cells to adjusted parameter (weight) values corresponding to a degradation classification of the one or more degraded memory cells for reducing a frequency of the writing operation.

Example 9: A non-transitory storage medium comprising programming code, which when executed by at least one data processor, causes operations comprising: detecting, during a training of a neural network, a degradation of one or more degraded memory cells of a memory array comprising a plurality of memory cells, at least a portion of the plurality of memory cells comprising an undegraded memory cell; determining, using a model of the memory array tuned to account for the degradation of one or more memory cells, a first set of writing parameter values to be applied to the one or more degraded memory cells and a second set of writing parameter values to be applied to the undegraded memory cells; and executing a writing operation, by applying the first set of writing parameter values to the one or more degraded memory cells to compensate for the degradation of the one or more degraded memory cells and by applying the second set of writing parameter values to the undegraded memory cell.

Example 10: The non-transitory computer-readable storage medium of example 9, wherein the plurality of memory cells comprise resistive memory cells.

Example 11: The non-transitory computer-readable storage medium of any of the preceding examples, wherein detecting the degradation of one or more degraded memory cells comprises: determining, using a degradation model, storing conductance values that are different from written conductance values, wherein the degradation model processes the plurality of memory cells using as input a value of maximum resistance and the written conductance values to generate a matrix of the storing conductance values.

Example 12: The non-transitory computer-readable storage medium of any of the preceding examples, wherein detecting the degradation of one or more degraded memory cells comprises: scanning, using a current meter, a conductance value of each memory cell of the plurality of memory cells; and determining a conductance change by comparing the conductance value of each memory cell to a previous conductance value stored by a buffer.

Example 13: The non-transitory computer-readable storage medium of any of the preceding examples, wherein the first set of writing parameter values and the second set of writing parameter values comprise a current, a voltage, a signal frequency or a pulse width.

Example 14: The non-transitory computer-readable storage medium of any of the preceding examples, wherein executing the writing operation, by applying the first set of writing parameter values to the one or more degraded memory cells to compensate for the degradation of the one or more degraded memory cells comprises reducing memory updates comprising a value of a writing amount, or a magnitude of change, or a frequency of change to the one or more degraded memory cells, wherein the memory updates correspond to parameter updates during a training scheme for neural networks.

Example 15: A system comprising: at least one data processor; and at least one memory storing instructions, which when executed by the at least one data processor, cause operations comprising: detecting, during a training of a neural network, a degradation of one or more degraded memory cells of a memory array comprising a plurality of memory cells, at least a portion of the plurality of memory cells comprising an undegraded memory cell; determining, using a model of the memory array tuned to account for the degradation of one or more memory cells, a first set of writing parameter values to be applied to the one or more degraded memory cells and a second set of writing parameter values to be applied to the undegraded memory cells; and executing a writing operation, by applying the first set of writing parameter values to the one or more degraded memory cells to compensate for the degradation of the one or more degraded memory cells and by applying the second set of writing parameter values to the undegraded memory cell.

Example 16: The system of example 15, wherein the plurality of memory cells comprise resistive memory cells.

Example 17: The system of any of the preceding examples, wherein detecting the degradation of one or more degraded memory cells comprises: determining, using a degradation model, storing conductance values that are different from written conductance values, wherein the degradation model processes the plurality of memory cells using as input a value of maximum resistance and the written conductance values to generate a matrix of the storing conductance values.

Example 18: The system of any of the preceding examples, wherein detecting the degradation of one or more degraded memory cells comprises: scanning, using a current meter, a conductance value of each memory cell of the plurality of memory cells; and determining a conductance change by comparing the conductance value of each memory cell to a previous conductance value stored by a buffer.

Example 19: The system of any of the preceding examples, wherein the first set of writing parameter values and the second set of writing parameter values comprise a current, a voltage, a signal frequency or a pulse width.

Example 20: The system of any of the preceding examples, wherein executing the writing operation, by applying the first set of writing parameter values to the one or more degraded memory cells to compensate for the degradation of the one or more degraded memory cells comprises reducing memory updates comprising a value of a writing amount, or a magnitude of change, or a frequency of change to the one or more degraded memory cells, wherein the memory updates correspond to parameter updates during a training scheme for neural networks.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and sub-combinations of the disclosed features and/or combinations and sub-combinations of several further features disclosed above. In addition, the logic flows depicted in the accompanying figures and/or described herein do not necessarily require the particular order shown, or sequential order, to achieve desirable results. For example, the logic flows can include different and/or additional operations than shown without departing from the scope of the present disclosure. One or more operations of the logic flows can be repeated and/or omitted without departing from the scope of the present disclosure. Other implementations can be within the scope of the following claims.

What is claimed is:

1. A method comprising:
   detecting a degradation of one or more degraded memory cells of a memory array comprising a plurality of memory cells, at least a portion of the plurality of memory cells comprising an undegraded memory cell, the degradation of one or more degraded memory cells being detected during the training of a neural network and comprising detecting a change in a value of a conductance of one or more degraded memory cells;
   determining, using a model of the memory array tuned to account for the degradation of one or more memory cells, a first set of writing parameter values to be applied to the one or more degraded memory cells and a second set of writing parameter values to be applied to the undegraded memory cells; and
   executing a writing operation, by applying the first set of writing parameter values to the one or more degraded memory cells to compensate for the degradation of the one or more degraded memory cells and by applying the second set of writing parameter values to the undegraded memory cell.

2. The method of claim 1, wherein the plurality of memory cells comprise resistive memory cells.

3. The method of claim 1, wherein detecting the change in the value of the conductance of one or more degraded memory cell comprises:
   determining, using a degradation model, stored conductance values that are different from written conductance values.

4. The method of claim 3, wherein the degradation model processes the plurality of memory cells using as input a value of maximum resistance and the written conductance values to generate a matrix of the storing conductance values.

5. The method of claim 1, wherein detecting the degradation of one or more degraded memory cells comprises:
   scanning, using a current meter, a conductance value of each memory cell of the plurality of memory cells; and
   determining a conductance change by comparing the conductance value of each memory cell to a previous conductance value stored by a buffer.

6. The method of claim 1, wherein the first set of writing parameter values and the second set of writing parameter values comprise a current, a voltage, a signal frequency or a pulse width.

7. The method of claim 1, wherein executing the writing operation, by applying the first set of writing parameter values to the one or more degraded memory cells to compensate for the degradation of the one or more degraded memory cells comprises reducing memory updates comprising a value of a writing amount, or a magnitude of change, or a frequency of change to the one or more degraded memory cells.

8. The method of claim 7, wherein the memory updates correspond to parameter updates during a training scheme for neural networks.

9. A non-transitory storage medium comprising programming code, which when executed by at least one data processor, causes operations comprising:
   detecting a degradation of one or more degraded memory cells of a memory array comprising a plurality of memory cells, at least a portion of the plurality of memory cells comprising an undegraded memory cell, the degradation of one or more degraded memory cells being detected during the training of a neural network and comprising detecting a change in a value of a conductance of one or more degraded memory cells;
   determining, using a model of the memory array tuned to account for the degradation of one or more memory cells, a first set of writing parameter values to be applied to the one or more degraded memory cells and a second set of writing parameter values to be applied to the undegraded memory cells; and
   executing a writing operation, by applying the first set of writing parameter values to the one or more degraded memory cells to compensate for the degradation of the one or more degraded memory cells and by applying the second set of writing parameter values to the undegraded memory cell.

10. The non-transitory computer-readable storage medium of claim 9, wherein the plurality of memory cells comprise resistive memory cells.

11. The non-transitory computer-readable storage medium of claim 9, wherein detecting the change in the value of the conductance of one or more degraded memory cell comprises:
determining, using a degradation model, stored conductance values that are different from written conductance values, wherein the degradation model processes the plurality of memory cells using as input a value of maximum resistance and the written conductance values to generate a matrix of the storing conductance values.

12. The non-transitory computer-readable storage medium of claim 9, wherein detecting the degradation of one or more degraded memory cells comprises:
scanning, using a current meter, a conductance value of each memory cell of the plurality of memory cells; and
determining a conductance change by comparing the conductance value of each memory cell to a previous conductance value stored by a buffer.

13. The non-transitory computer-readable storage medium of claim 9, wherein the first set of writing parameter values and the second set of writing parameter values comprise a current, a voltage, a signal frequency or a pulse width.

14. The non-transitory computer-readable storage medium of claim 9, wherein executing the writing operation, by applying the first set of writing parameter values to the one or more degraded memory cells to compensate for the degradation of the one or more degraded memory cells comprises reducing memory updates comprising a value of a writing amount, or a magnitude of change, or a frequency of change to the one or more degraded memory cells, wherein the memory updates correspond to parameter updates during a training scheme for neural networks.

15. A system comprising:
at least one data processor; and
at least one memory storing instructions, which when executed by the at least one data processor, cause operations comprising:
detecting a degradation of one or more degraded memory cells of a memory array comprising a plurality of memory cells, at least a portion of the plurality of memory cells comprising an undegraded memory cell, the degradation of one or more degraded memory cells being detected during the training of a neural network and comprising detecting a change in a value of a conductance of one or more degraded memory cells;
determining, using a model of the memory array tuned to account for the degradation of one or more memory cells, a first set of writing parameter values to be applied to the one or more degraded memory cells and a second set of writing parameter values to be applied to the undegraded memory cells; and
executing a writing operation, by applying the first set of writing parameter values to the one or more degraded memory cells to compensate for the degradation of the one or more degraded memory cells and by applying the second set of writing parameter values to the undegraded memory cell.

16. The system of claim 15, wherein the plurality of memory cells comprise resistive memory cells.

17. The system of claim 15, wherein detecting the change in the value of the conductance of one or more degraded memory cell comprises:
determining, using a degradation model, stored conductance values that are different from written conductance values, wherein the degradation model processes the plurality of memory cells using as input a value of maximum resistance and the written conductance values to generate a matrix of the storing conductance values.

18. The system of claim 15, wherein detecting the degradation of one or more degraded memory cells comprises:
scanning, using a current meter, a conductance value of each memory cell of the plurality of memory cells; and
determining a conductance change by comparing the conductance value of each memory cell to a previous conductance value stored by a buffer.

19. The system of claim 15, wherein the first set of writing parameter values and the second set of writing parameter values comprise a current, a voltage, a signal frequency or a pulse width.

20. The system of claim 15, wherein executing the writing operation, by applying the first set of writing parameter values to the one or more degraded memory cells to compensate for the degradation of the one or more degraded memory cells comprises reducing memory updates comprising a value of a writing amount, or a magnitude of change, or a frequency of change to the one or more degraded memory cells, wherein the memory updates correspond to parameter updates during a training scheme for neural networks.

* * * * *